United States Patent
Daughton et al.

(10) Patent No.: US 6,300,617 B1
(45) Date of Patent: Oct. 9, 2001

(54) MAGNETIC DIGITAL SIGNAL COUPLER HAVING SELECTED/REVERSAL DIRECTIONS OF MAGNETIZATION

(75) Inventors: James M. Daughton, Eden Prairie; Robert T. Fayfield, St. Louis Park; Theodore M. Hermann, Eden Prairie; John F. Stokes, Rochester, all of MN (US)

(73) Assignee: Nonvolatile Electronics, Incorporated, Eden Prairie, MN (US)

( * ) Notice: Subject to any disclaimer, the term of this patent is extended or adjusted under 35 U.S.C. 154(b) by 0 days.

(21) Appl. No.: 09/261,899

(22) Filed: Mar. 3, 1999

Related U.S. Application Data

(60) Provisional application No. 60/076,716, filed on Mar. 4, 1998.

(51) Int. Cl.$^7$ .................................................. H01L 31/00
(52) U.S. Cl. .................. 250/214.1; 250/551; 324/252
(58) Field of Search ................. 250/214.1, 551, 250/214 R, 206, 216; 324/252, 253, 259, 260, 263, 251

(56) References Cited

U.S. PATENT DOCUMENTS

| | | | |
|---|---|---|---|
| 5,206,590 | 4/1993 | Dieny et al. | 324/252 |
| 5,260,653 | 11/1993 | Smith et al. | 324/252 |
| 5,399,965 | 3/1995 | Heberle | 324/117 H |
| 5,561,368 | 10/1996 | Dovek et al. | 324/252 |
| 5,589,709 | 12/1996 | Dobkin et al. | 257/666 |
| 5,617,071 | 4/1997 | Daughton | 338/32 R |
| 5,831,426 | 11/1998 | Black, Jr. et al. | 324/127 |
| 5,951,459 * | 9/1999 | Blackwell | 600/13 |

FOREIGN PATENT DOCUMENTS

| | | |
|---|---|---|
| 0 594 243 A | 4/1994 | (EP) . |
| 10 026639 | 4/1998 | (JP) . |
| WO 98 07165 | 2/1998 | (WO) . |
| WO 98/37672 | 2/1998 | (WO) . |

* cited by examiner

*Primary Examiner*—Que T. Le
(74) *Attorney, Agent, or Firm*—Kinney & Lange, P.A.

(57) ABSTRACT

A current determiner having an output at which representations of input currents are provided comprising an input conductor for the input current and a current sensor supported on a substrate electrically isolated from one another but with the sensor positioned in the magnetic fields arising about the input conductor due to any input currents. The sensor extends along the substrate in a direction at an angle to the extent of the input conductor and is formed of at least a pair of thin-film ferromagnetic layers separated by a nonmagnetic layer with one of these two ferromagnetic thin-film layers having a magnetization that is substantially maintained in a selected direction despite the magnetic fields arising from the input currents causing reversals of direction of magnetization of that remaining one of these two ferromagnetic thin-film layers. This first current sensor is spaced apart from the input conductor at least in part by a polymeric electrical insulating material, and the input conductor can be provided on a mechanically stiff base supported on such material and provided with an electric field interrupter supporting such material between the first current sensor and the input conductor. The sensor can be electrically connected to a electronic circuitry formed in the substrate as a monolithic integrated circuit sharing a common reference, and two such monolithic integrated chips in a housing can provide duplex information signal transmission.

41 Claims, 11 Drawing Sheets

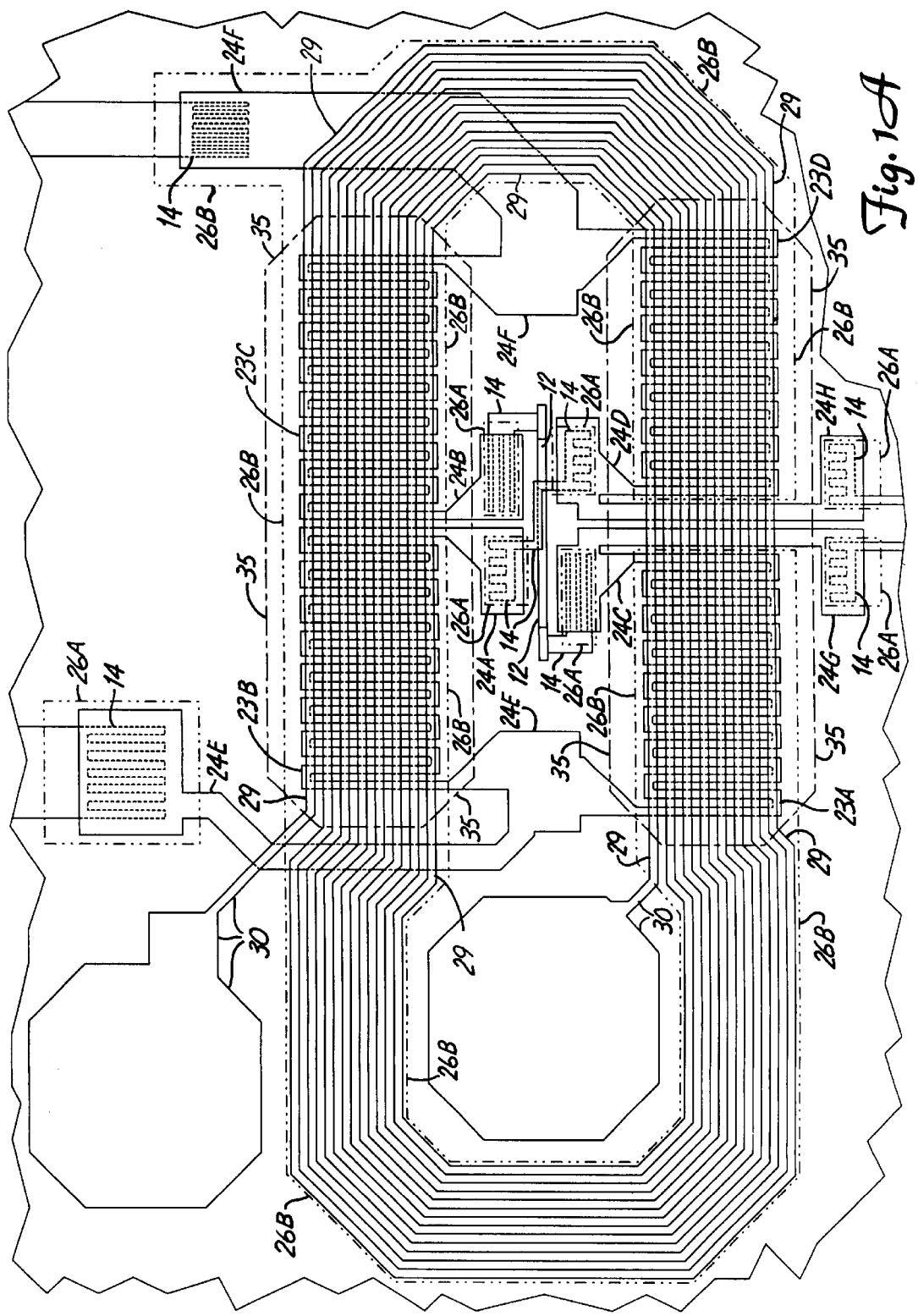

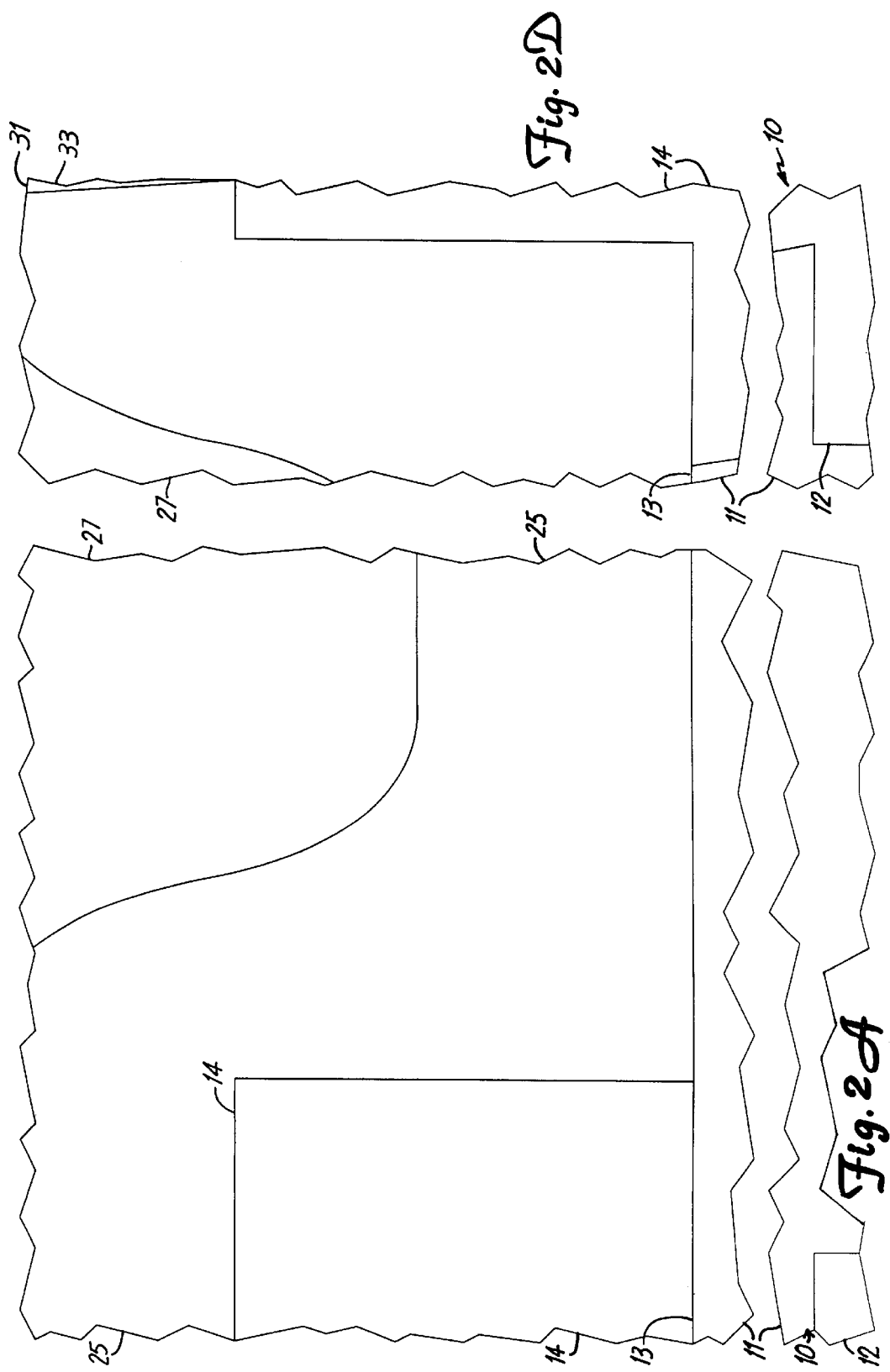

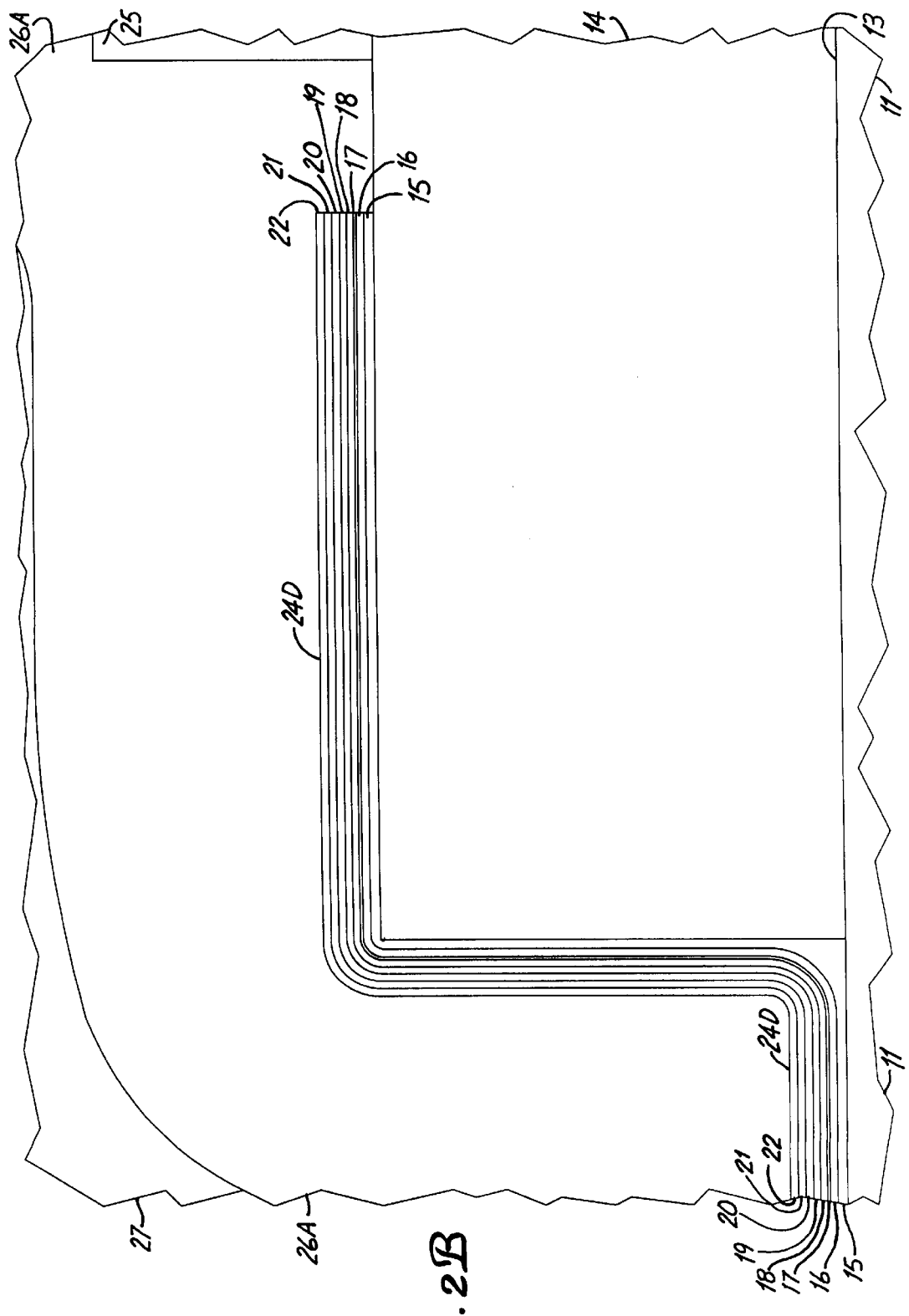

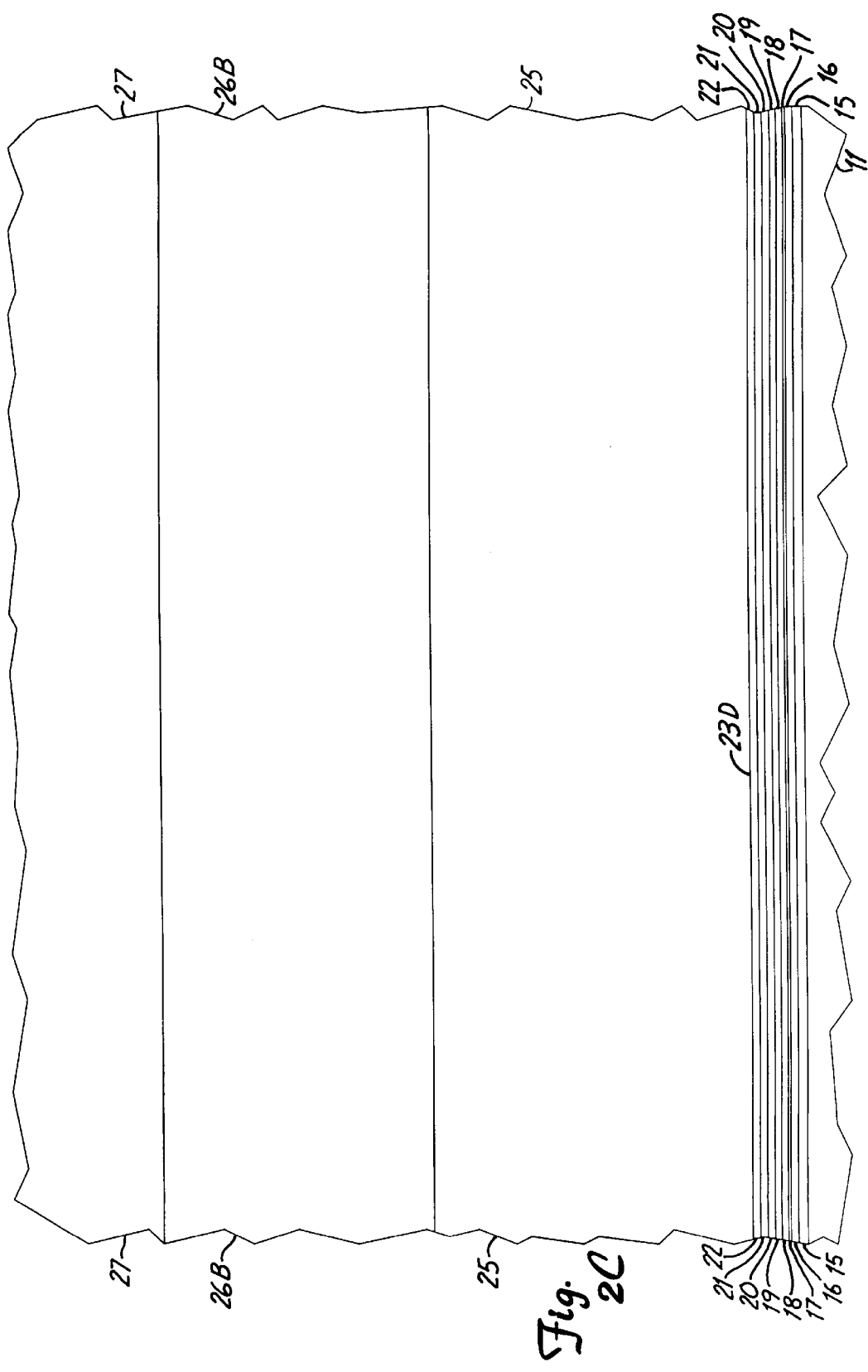

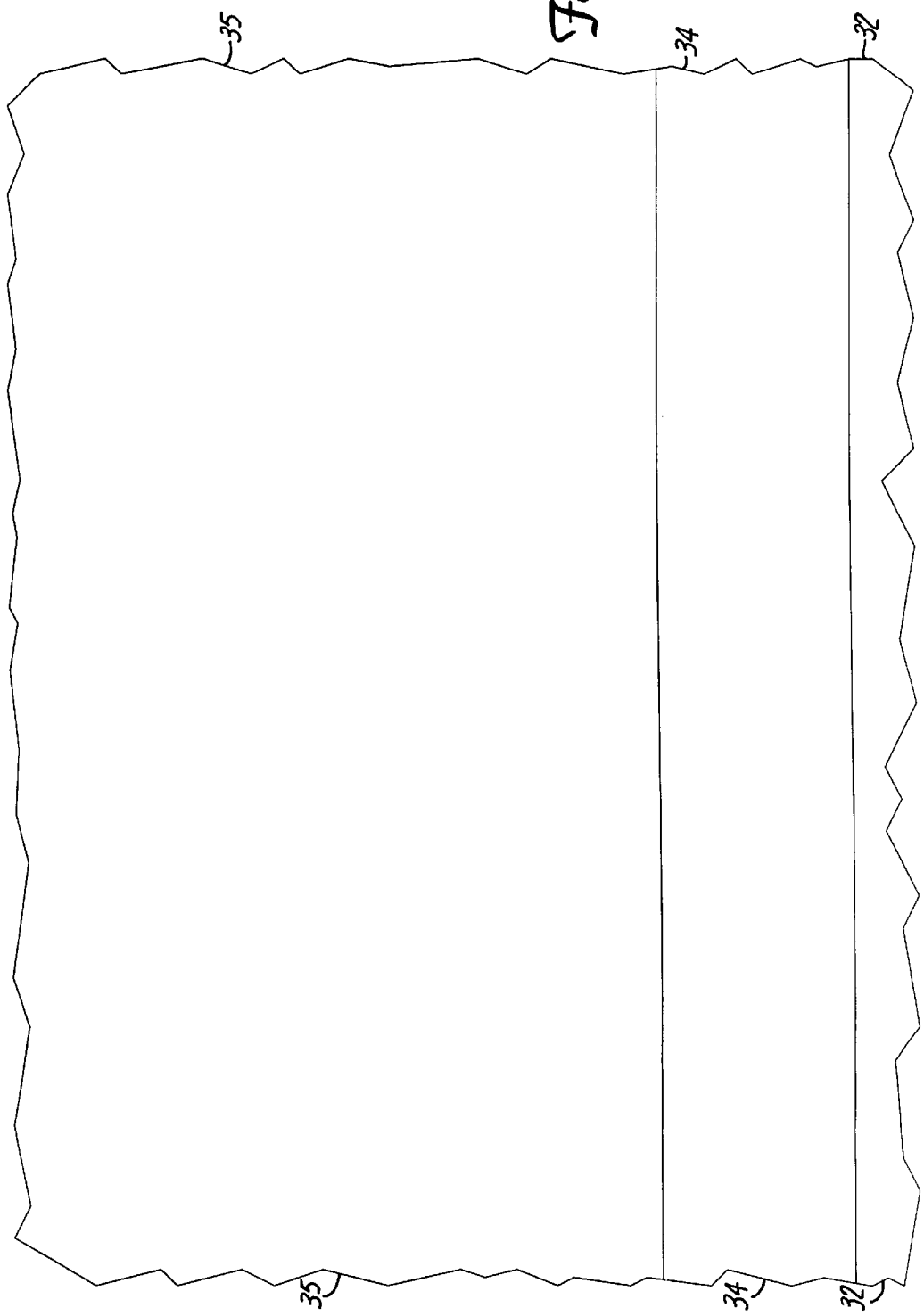
Fig. 2CCC

MAGNETIC DIGITAL SIGNAL COUPLER HAVING SELECTED/REVERSAL DIRECTIONS OF MAGNETIZATION

CROSS-REFERENCE TO RELATED APPLICATION

This application claims priority from Provisional Application No. 60/076,716, filed Mar. 4, 1998, entitled Rapidly Varying Signal Isolator.

BACKGROUND OF THE INVENTION

The present invention relates to ferromagnetic thin-film structures exhibiting relatively large magnetoresistive characteristics and, more particularly, to such structures used to couple digital signals from a source to an isolated receiver magnetically.

Many kinds of electronic systems make use of magnetic devices including both digital systems, such as memories, and analog systems such as field sensors. Magnetometers and other magnetic sensing devices are used extensively in many kinds of systems including magnetic disk memories and magnetic tape storage systems of various kinds. Such devices provide output signals representing the magnetic field sensed thereby in a variety of situations.

One use for such magnetic field sensors is the sensing of magnetic fields generated by electrical currents in a conductor as a basis for inferring the nature of such current giving rise to these fields. While this has long been done for magnetic fields generated by substantial currents, such sensing becomes more difficult to accomplish in lesser ranges of currents that include relatively small currents. The need for sensing fields due to such small currents arises, for instance, in situations where the currents generating the fields to be measured are provided merely as a basis for conveying signal information rather than for transmitting substantial electrical energy.

Such a situation occurs in many medical systems, instrumentation systems and control systems where there is often a need to communicate signals to system portions over signal interconnections from an external source or from another portion of the system. Often, the conductors carrying signal currents for such purposes must be electrically isolated from the portion of the system containing the sensor arrangement for those signals to measure the resulting magnetic fields. As an example, a long current loop carrying signal information in the loop current may, through lightning or static electricity discharges, become subject to having large voltage potentials relative to ground developed thereon. Such potentials must in many instances be kept from the signal sensing and receiving circuitry to avoid damage thereto even though that circuitry must still be able to capture the signal information contained in the loop current.

Signal isolators for these purposes are often preferably formed in monolithic integrated circuit chips for reasons of cost, convenience and system performance. In such an arrangement, one or more solid state magnetic field sensors are used to detect the magnetic fields provided by the currents containing the signals. A kind of magnetic field sensor which has been used in this situation is a Hall effect device. Such devices are often not satisfactory for sensing the magnetic fields due to small currents because of the limited sensitivity they exhibit with respect to magnetic fields.

Furthermore, there is often a lack of satisfactory remedial or supplementary measures in such arrangements for improving the limited sensitivity of Hall effect devices. The use of field concentrators is difficult to provide in a monolithic integrated circuit containing a Hall device because of the magnetically sensitive axis of that device being perpendicular to the directions the Hall device in the monolithic integrated circuit extends over the substrate supporting that device, i.e. the device axis of sensitivity is parallel to the thickness of the device rather than to the width or length thereof. Also information provided by Hall devices as to the magnetic fields measured thereby is in the form of a voltage which limits the use of such devices in bridge circuits which might otherwise be used for purposes of increasing the output signal providing the current signal information.

Another possibility in either hybrid integrated circuits or monolithic integrated circuits for signal isolation is the use of a light source having its electromagnetic radiation intensities controlled by signal currents from a signal source. Such a light source is electrically isolated from a light detector provided in the integrated circuit that is used to infer the nature of the signal currents from the light transmitted to and received thereby. Difficult engineering and economic problems make this an unsatisfactory solution as are various alternative capacitance based coupling solutions because of the same kinds of problems.

A further possibility has emerged in these circumstances for signal isolation in both hybrid integrated circuits and monolithic integrated circuits involving a current determiner comprising an input conductor, typically in some coiled configuration, and a current sensor both supported on a substrate adjacent to and spaced apart from one another so they are electrically isolated but with the current sensor positioned in those magnetic fields arising from any input currents in the input conductor. Such an isolated signals current determiner is an attractive device for these purposes in being both rapid in operation and economical in cost, and has been disclosed in U.S. Pat. No. 5,831,426 to W. C. Black and T. M. Hermann entitled Magnetic Current Sensor which is assigned to the same assignee and hereby incorporated herein by reference.

In the recent past, providing such current sensors as magnetoresistive effect based sensors in the form of an intermediate thin layer of an electrically conductive, non-magnetic separating material having two major surfaces on each of which an anisotropic ferromagnetic thin-film is positioned has been found to lead to a "giant magnetoresistive effect" in the sensor if the thicknesses of the ferromagnetic thin-films and the intermediate layers in such a "sandwich" structure have been made sufficiently small. This effect can be enhanced by forming such sensors with additional alternating ones of these ferromagnetic films and intermediate layers to form superlattices. The resulting enhanced "giant magnetoresistive effect" can yield a magnetoresistive response which can be in the range of up to an order of magnitude greater than that due to the well known anisotropic magnetoresistive response. Sensors similar to those described herein for sensing magnetic fields external to those monolithic integrated structure devices containing such sensors are described in U.S. Pat. No. 5,617,071 to J. M. Daughton entitled "Magnetoresistive Structure Comprising Ferromagnetic Thin Films Having Magnetic Concentrator and Shielding Permeable Masses" and in an earlier filed co-pending application by J. M. Daughton entitled "Magnetic Structure with Stratified Layers" having Ser. No. 08/096,765, now abandoned, both assigned to the same assignee as the present application and hereby incorporated herein by reference.

Such an isolated signal current determiner can be used to couple digital data input signals provided in an input conductor to a receiver isolated from the input conductor, the input signals then being substantially replicated in a receiver circuit to provide replicas of those input signals at the receiver output. This is often a satisfactory arrangement for coupling digital data input signals into a system isolated from the source of the input signals, but in some situations too much power is consumed in providing those input signals. In other situations, a higher withstanding voltage is required in providing the signal isolation than has been available heretofore. Thus, there is a need for a signal isolation device exhibiting relatively high sensitivity, relatively high power efficiency and relatively high withstanding voltage, or some combination thereof, and which can be fabricated at a reasonably economic cost.

BRIEF SUMMARY OF THE INVENTION

The present invention provides a current determiner having an output at which representations of input currents are provided for input currents that are supplied from a source, the current determiner comprising an input conductor and a first current sensor both supported on a substrate adjacent to and spaced apart from one another so they are electrically isolated with the first current sensor positioned in those magnetic fields arising from any input currents. The first current sensor is formed of a plurality of magnetoresistive, anisotropic, ferromagnetic thin-film layers at least two of which are separated from one another by a nonmagnetic layer positioned therebetween with one of said two ferromagnetic thin-film layers having a magnetization that is substantially maintained in a selected direction despite the magnetic fields arising from said input currents causing reversals of direction of magnetization of that remaining one of these two ferromagnetic thin-film layers. This first current sensor is spaced apart from the input conductor at least in part by a polymeric electrical insulating material, and the input conductor can be provided on a mechanically stiff base supported on such material and provided with an electric field interrupter supporting such material between the first current sensor and the input conductor.

The first current sensor extends primarily along a first direction across the substrate and the input conductor extends primarily along a second direction across the substrate which may be approximately orthogonal to the first direction or at some greater angle with respect thereto. A layer of material exhibiting a substantial magnetic permeability can be used therewith positioned near both the input conductor and the first current sensor to serve as a magnetic field concentrator and as a shield against any unwanted external magnetic fields. More than one such permeable material layer can be positioned near both the input conductor and a portion of the first current sensor if the current sensor is formed of more than one substructure portion such as a bridge circuit implementation.

This sensor can be electrically connected to other electronic circuitry formed in the substrate provided as a monolithic integrated circuit chip and share a common voltage reference. Two such monolithic integrated circuit chips can be provided in a common housing to provide duplex signal transmission.

BRIEF DESCRIPTION OF THE DRAWINGS

FIGS. 1A and 1B represent a plan view of a portion of a monolithic integrated circuit structure embodying the present invention, FIGS. 2A, 2B, 2C, 2CC, 2CCC and 2D represent layer diagrams of parts of the structure portion shown in FIG. 1.

DETAILED DESCRIPTION

Figure 1B:
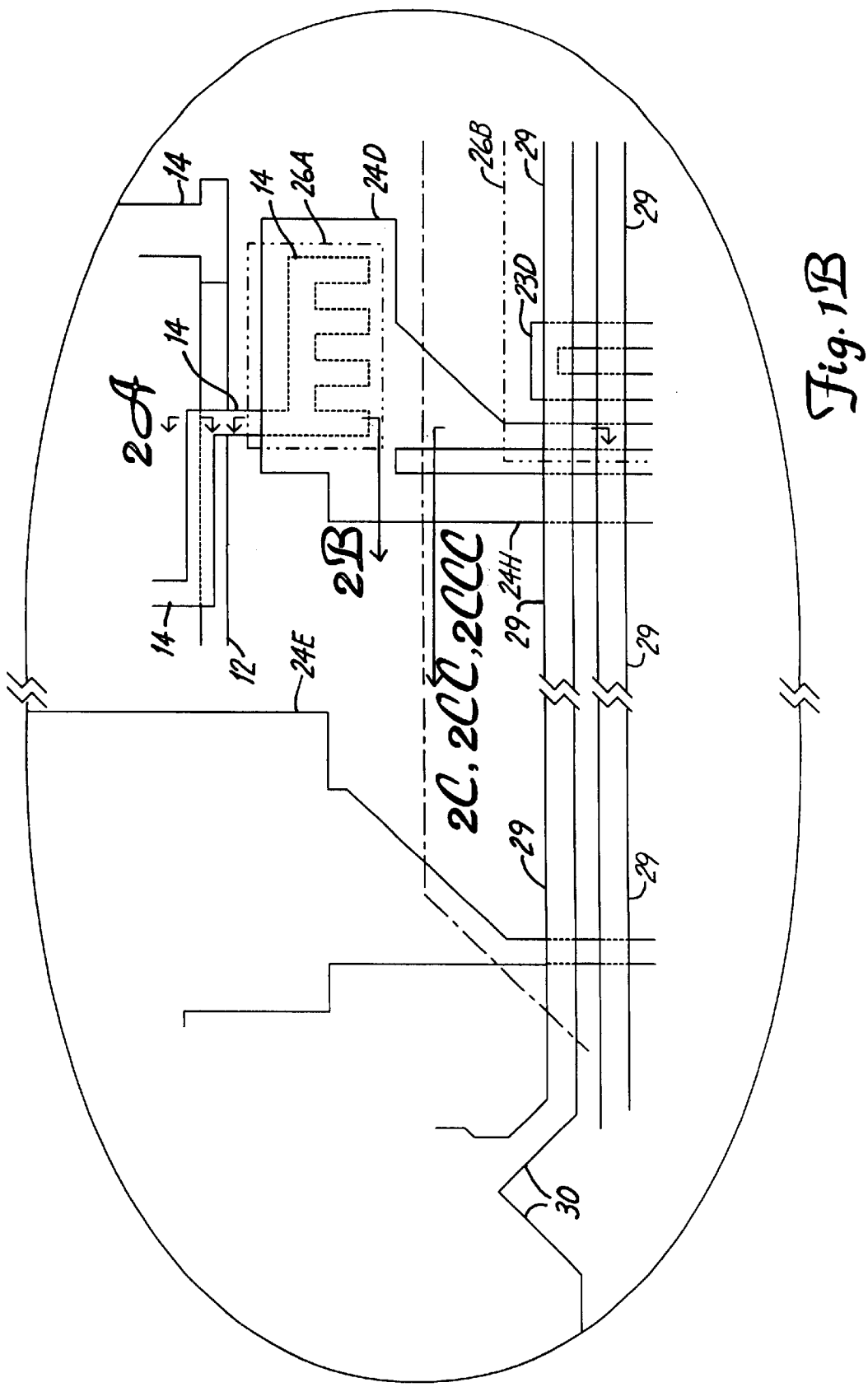

A basic "sandwich" structure magnetic field sensor has a sensor electrical resistance versus applied external field characteristic for an external magnetic field applied in one direction perpendicular to its easy axis that generally appears in its graph on a resistance versus field Cartesian coordinates graph as a horizontal line at the sensor minimum resistance value except for an excursion therein to greater resistance values located at or near to the zero applied magnetic field value. This excursion typically appears as a more or less isosceles triangular shaped increase to a peak sensor resistance value followed by a decrease to the minimum sensor resistance value, or it may appear to be a triangular shaped excursion to higher resistance values except for a plateau at the top thereof at the maximum sensor resistance value. Thus, plotting the characteristics resulting from applying external magnetic fields in both directions perpendicular to the sensor easy axis on the same graph results in a pair of overlapping triangular excursion graphs approximately centered about the zero external applied field value as the basic "sandwich" structure current sensor resistance versus external field characteristic.

Such a characteristic has no sharp switching thresholds therein thus requiring such thresholds to be provided in the subsequent electronic circuitry. In smaller sized sensors where the demagnetization fields in the sensor magnetic layers become relatively more significant, the triangular shape shifts so as to provide a side more closely paralleling the resistance axis of the graph to thereby result in providing magnetic switching thresholds in the current sensor itself. Also, the double triangle characteristic described above for the basic "sandwich" structure field sensor is symmetrical on both sides of the zero value of externally applied fields.

Thus, some sort of a bias such as a bias magnetic field must be supplied to such field sensors connected in sensor bridge circuits to force one pair of those sensors to operate on one side of their triangular characteristics and the other pair to operate on the other triangular side of their triangular characteristics if field directions are to be distinguishable. This asymmetry introduced by the bias field makes possible the two pairs of those sensors in such circuits changing their electrical resistances in opposite directions in the presence of an external applied field so as to make available a bridge circuit output signal. Such a bias field requirement also limits the magnitudes of external applied fields to be sensed to being less than the bias field magnitude for proper operation. Alternatively, a current bias could be introduced in the input conductor in which signal currents generate magnetic fields to be sensed by some current sensors in a bridge circuit to set a reference point about which input current changes will result in corresponding output signal changes. A further alternative is to just provide a field absolute value sensor.

A "pinned" layer "sandwich" structure is provided by a "spin valve" structure in which one magnetic layer in a "sandwich" structure has its magnetization firmly maintained in a selected direction despite significant applied external magnetic fields while the other magnetic layer is quite free to have its magnetization rotate in response to such applied external magnetic fields. This structure results in a sensor electrical resistance versus applied external field characteristic for an external magnetic field applied in both directions perpendicular to the sensor easy axis that generally appears shaped like a traditional magnetic hysteresis curve centered on a zero applied field. This device electrical resistance versus external applied field hysteresis characteristic shown on a resistance versus field Cartesian coordinates graph has two more or less parallel sides approximately centered about the zero external applied field value each with a substantial directional component paralleling the resistance axis. These sides extend between an upper saturation value at the maximum resistance value of the sensor and a lower saturation value at the minimum resistance value of the sensor so that these sides represent magnetic switching thresholds leading to asymmetrical saturation resistance values on the opposite sides of the zero value of externally applied magnetic fields.

Because of this asymmetry in the sensor electrical resistance versus applied external field characteristic, i.e. the upper saturation value at the maximum resistance value of the sensor on one side of zero value of externally applied magnetic fields and the lower saturation value at the minimum resistance value of the sensor on the other, no bias magnetic field or bias current is needed for such sensors in bridge circuits. Changes in input current polarity in the input conductor will lead directly to changes in bridge output signal polarity.

The magnetic layer in the "pinned" layer "sandwich" structure having a relatively freely orientable magnetization is, as indicated, intended to be magnetically more or less independent of the magnetic layer therein having a fixed orientation magnetization. The nonmagnetic conducting layer is chosen to be relatively thick so that there is relatively little exchange coupling between the two magnetic film layers in this structure, and there is also a relatively small magnetostatic coupling therebetween. Although these characteristics can also be true of a basic "sandwich" structure, they do not provide an asymmetry in the electrical resistance versus applied external field characteristic for such structures.

Thus, going to a "spin valve" structure for the current sensor in the signal isolator avoids the need for any biasing arrangement. Furthermore, the resulting bipolar output signal in a bridge can be used to provide a doubling of the output signal magnitude range in response to input digital data pulses.

In addition, the presence of an effective switching value hysteresis as a result of the current sensor resistance versus applied external magnetic field characteristic of the "spin valve" structure serves to effectively filter out electrical noise accompanying the digital data current pulses in the input signal provided to the signal isolator input conductor or conductor coil. This comes about because the switching of the free magnetic layer in the current sensor "spin valve" structure, once it occurs, will not be undone by such noise due to this hysteresis requiring a significantly different input conductor current value to again switch the magnetization direction of that free layer from the value which previously switched that direction. Thus, the output from the current sensor is a "squared up" signal having relatively little variation from the normal logic value magnitudes expected therein as compared to the digital data input signal applied to the input conductor.

Of course, the maximum signal power can be extracted from the digital data input signal supplied to the isolator input conductor or conductor coil by choosing that input conductor to have an effective impedance which matches the characteristic impedance of the input transmission line connected thereto. Thus, the number of turns in the input conductor coil, the length and the resistance of the individual loops in the coil can be adjusted to have its characteristic impedance closely match that of the incoming transmission line, although in some situations these choices must be supplemented by the use therewith of further structures to provide such a match.

The digital data current pulses occurring in the input conductor or conductor coil after transmission thereto over a transmission line must, of course, have sufficient current magnitude to provide the necessary magnetic fields thereabout to reach the saturation magnetization magnitudes of the "spin valve" current sensor. Thus, substantial electrical power can be dissipated in transmitting such input digital data current pulse logic value signals over longer transmission lines. Such power requirements can be significantly further reduced by providing, instead of pulses representing a binary bit by maintaining an essentially constant logic value current magnitude over the entire pulse rate period, just an impulse-like current flow at the beginning of such a pulse rate period in which such a logic value pulse is to occur. That is, a very short initial pulse in a pulse rate period can take the place of a digital data current pulse lasting the entire pulse rate period to thereby significantly reduce the electrical power involved. The minimum duration of the impulse-like current pulse must exceed the rise time of the magnetization orientation change in the "spin valve" current sensor to the switching threshold as increased by the loading of any parasitic circuit components effective in the transmission of an input conductor pulse to become a corresponding current sensor output signal pulse.

Also, in many situations, the signal isolator user will desire to provide only typical logic signals that are generated in whatever logic system technology the user is employing at the logic signal generation source to provide the basis for transmitting digital data on the transmission line connected to the input of the signal isolator. That is, for instance, the signal source may be a monolithic integrated circuit fabricated using complementary metal-oxide-semiconductor (CMOS) technology to result in that integrated circuit providing at its output digital logic circuitry logic value voltage magnitudes common to that technology. Since such logic signals typically will not have sufficient current or power capability to operate the input conductor or coiled conductor of a signal isolator, a circuit must be provided ahead of that input conductor for converting logic value voltage magnitudes in a particular monolithic integrated circuit technology to current magnitudes sufficient to operate the input conductor.

Thus, an input signal converter will be convenient to provide at the signal isolator input for both of these purposes. Such a converter will be used to convert standard logic value voltage magnitude pulses for some particular signal source technology to impulse-like current pulses at the beginning of pulse rate periods to operate the input conductor or coiled conductor of the signal isolator. This will free a user of the signal isolator from any need to change the usual output digital logic signals from the user's signal source in any way to meet the needs of that isolator, and frees that user from having to supply the power needed by the signal isolator to operate. Again, the input of this converter can be adjusted to have its characteristic impedance closely match that of the incoming transmission line including the use therewith of specific circuit structures to provide such a match.

Sequences of digital data logic value pulses can be converted to corresponding impulse-like current excursions by submitting those sequences of digital data logic value pulses to an analog differentiator so that corresponding impulse-like voltage excursions of opposite polarity occur at the differentiator output for both the leading edge and the trailing edge of each such pulse. However, such differentiation of a signal is an inherently a noise generation process with that noise typically increasing in magnitude as the pulse rate increases. Thus, substituting instead a very short duration pulse or impulse-like current excursion at the leading and trailing edges of each digital data logic value pulse approximates the differentiating process without generating as much unwanted electrical noise.

Again, the minimum pulse width for these very short current pulses must exceed the rise time of the magnetization orientation of the "spin valve" current sensor to its rotational threshold value as increased by any parasitics involved with this circuit arrangement. Typically, assured switching with such short duration current pulses or excursions requires that the pulse amplitude be well beyond those necessary to provide magnetic fields that just reach the saturation magnetization magnitudes of the "spin valve" current sensor. Nevertheless, because of the shortness of the current excursion duration, there will be a decrease in electrical power dissipated.

After such generation of current excursions in the input conductor or coiled conductor of the signal isolator, recovering the corresponding digital data from the isolator current sensor is determined in part at least by the nature of the electrical resistance versus applied external magnetic field characteristic of that current sensor. As indicated above, this characteristic for a "spin valve" based "sandwich" structure appears as a hysteresis loop approximately centered on a zero applied external field value, and having more or less parallel sides typically representing magnetic saturation or switching thresholds extending between the sensor minimum resistance value and maximum resistance value which sides have a substantial directional component parallel to the resistance axis. The current sensor can be forced to one or the other of these extreme resistance value states by applying external magnetic fields having magnitudes exceeding the magnitudes of the magnetic saturation or switching threshold values.

If the hysteresis characteristic parallel sides have the directional components thereof which are parallel to the resistance axis of the graph also being relatively small, the primary direction of the hysteresis loop between the minimum and maximum resistance values appears canted with respect to the resistance value axis. As a result, the resistance value for the current sensor after the removal of an applied external field will be either significantly less than the maximum resistance value for the current sensor or significantly more than the minimum resistance value for that current sensor.

In this circumstance, a data latch needs to be used across the current sensor output to provide "memory", i.e. to retain the information as to which of the extreme resistance value states last occurred in the current sensor as a result of the occurrence of a short term current pulse in the input conductor. That is, the occurrence in the current sensor of a maximum resistance state value or a minimum resistance state value, corresponding to the largest output voltage signals from the current sensor in response to a sense current or bridge operating current provided therethrough, will cause the data latch to go into one of its logic states or the other. This logic state in the latch thus represents the information as to which extreme resistance value last occurred in the current sensor which information could otherwise be lost because of the final resistance value of the current sensor after being in such a state when the magnetic field generated about the input conductor has gone to zero being relatively similar following the sensor having been in either extreme resistance state. This closeness of the final resistance values of the sensor upon the removal of any significant external magnetic field following such a field having forced the sensor to either extreme resistance value state occurs because of the canting of the hysteresis loop with respect to the resistance axis of the graph.

On the other hand, a resistance versus applied external field characteristic for a current sensor in the form of a hysteresis loop having sides with directional components parallel to the resistance axis of the graph that are relatively large leaves the loop appearing relatively "square" in that graph. In this situation, the current sensor has final resistance values upon the removal of any significant external magnetic field following such a field having forced the sensor to either extreme resistance value state which are close in value to the resistance value of the corresponding last extreme resistance value state which occurred in that sensor. In these circumstances, a data latch is not needed across the current sensor output because the memory of the last extreme resistance value state occurring in the current sensor is effectively stored in that sensor by the final resistance value occurring in the sensor after removal of the applied external magnetic field. A sense current or bridge operating current provided through the sensor will result in corresponding output voltages for each final resistance value sufficiently different from one another to be relatively easily distinguishable by the subsequent circuitry connected to the sensor output.

Thus, there is a desire to obtain a hysteresis loop for a current sensor having a resistance versus applied external field characteristic in the form of a hysteresis loop which has the main extent thereof between the sensor maximum and minimum resistance value states extending substantially parallel to the resistance axis to yield a "squared up" appearance. This requires that the externally applied magnetic field to be sensed in the current sensor be oriented substantially parallel to the easy axes of the magnetic material layers therein. Thus, the input current conductor, or the main extent of a coiled conductor, is to be provided substantially perpendicular to the easy axes of the magnetic layers in the current sensor. The resulting current sensor will then "remember" the last extreme resistance value state to which it was forced by external magnetic fields generated by current excursions in the input conductor or coiled conductor in its final resistance value occurring after the removal of such an externally applied magnetic field.

On the other hand, a current sensor having a resistance versus applied external field characteristic in the form of a canted hysteresis loop also is desirable even though added hysteresis has to be provided in the electronic circuitry connected to the current sensor output. This is because magnetization direction reorientation is primarily accomplished by rotational switching and only relatively limited magnetic field changes are needed to do so. As a result, very rapid magnetization direction reversals occur, the current sensor devices can be compact, and lower power dissipation occurs in the input conductor. Such a loop requires that the externally applied magnetic field to be sensed in the current sensor be oriented substantially perpendicular to the easy axes of the magnetic material layers therein. Thus, the input current conductor, or the main extent of a coiled conductor, is to be provided substantially parallel to the easy axes of the magnetic layers in the current sensor.

Although such a current sensor is attractive for providing a digital data signal isolator, the input signal to the input conductor is subject to common mode sharp signal excursions which accentuate the isolation problem. This input-output isolation problem is engendered by the parasitic capacitances existing between the input conductor and the current sensor. Such very short time duration common mode signal excursions in the input conductor excite very high circuit current and voltage frequencies which are more easily coupled across these parasitic capacitances from the input conductor to the current sensor in effect forming a circuit having the parasitic capacitance in series with the current sensor resistance to ground. The resulting possibility of a large common mode voltage change across the current sensor corresponding to the common mode change in the input signal can have deleterious effects in the current sensor output signal such as the occurrence of noise spikes that can be coupled through to subsequent circuitry provided for operating on that output signal to cause unwanted logic state changes therein.

There are two primary parasitic signal coupling paths, the first being a direct parasitic capacitance extending between the input conductor or coiled conductor directly to the current sensor. A more indirect path also exists, however, this involving parasitic capacitance between the input conductor or conductor coil and the substrate, and a corresponding parasitic capacitance between that same substrate and the current sensor. Unwanted signal transmissions along this latter indirect parasitic transmission path can be substantially eliminated by connecting the reference point serving as ground in the circuitry connected to the current sensor directly to the substrate ground reference in the circuitry in monolithic integrated circuit in chip 10 to thereby short circuit the parasitic capacitance otherwise existing between the substrate and the current sensor.

The direct parasitic capacitance transmission path provided by the parasitic capacitance coupling the input inductor or conductor coil directly to the current sensor across the electrical insulating material therebetween requires an electric field interrupter in those situations in which the parasitic capacitance is sufficiently large to couple higher frequencies of input conductor circuit variables to the current sensor to significantly disrupt the output circuits operation. This electric field interrupter is to provide a shunt path to ground for such unwanted signals in what would otherwise be a direct parasitic capacitance coupling path. Such an electric field interrupter can be provided by a metal structure positioned between the input conductor or conductor coil and the current sensor with that metal structure being connected to ground in the circuitry to which the current sensor is interconnected. The metal structure, although electrically conductive, should be of a large enough resistivity so as to significantly reduce the effects of any eddy currents generated therein.

Furthermore, this electric field interrupter metal structure must be compatible with the electrical insulating material provided between the input conductor or conductor coil and the current sensor so as not to reduce the withstanding voltage available between the input conductor or conductor coil and the current sensor, i.e. not aid in any electrical breakdown of the insulating material between the input conductor and the current sensor. Although an electrical insulating material common to monolithic integrated circuit fabrication processes can be used as the electrical insulating material between the input conductor or conductor coil and the current sensor such as silicon dioxide or silicon nitride, such insulators can catastrophically break down nearly instantaneously when the breakdown voltage value thereacross is exceeded without recovering its insulating value after the voltage causing breakdown is reduced below the breakdown value. A polymer, on the other hand, as the insulating material has been found in many instances to have a much more gradual resistance drop when the breakdown voltage that material is exceeded, and to fully recover its insulating electrical resistance value after the voltage between the input conductor and the current sensor is reduced to below the breakdown value.

Signal isolators, based on the magnetoresistive sensing of corresponding magnetic conditions generated therein by input signals delivered to its input, that are formed in accord with the foregoing structural parameters can be advantageously fabricated using ferromagnetic thin-film materials. Such devices may be provided on a surface of a monolithic integrated circuit to thereby allow providing convenient electrical connections between the sensor device and the operating circuitry therefor, although they need not be so provided, as they can be provided in hybrid integrated circuit arrangements too, or combinations thereof.

FIG. 1A shows a plan view of a part of a signal isolator formed as a portion of a monolithic integrated circuit including a supporting semiconductor chip as part of the isolator substrate which can have conveniently provided therein the operating circuitry for this signal isolator. FIG. 1B is an enlarged view of a portion of FIG. 1A to allow a clearer showing of section lines added therein. Alternatively, the signal isolator could be formed as part of a hybrid integrated circuit on a ceramic substrate. The optional protective layer that is provided over the structure shown in these figures in actual use has been omitted in this view for clarity as have some other layers so that the structure portions are shown in solid line form except for structure portions beneath other structure portions appearing in those figures which are shown in dashed line form. A further exception is that some other structures have been indicated in outline only by further alternative dashed lines forms again for clarity to avoid having these structures cover over other underlying structures.

Figure 2C:
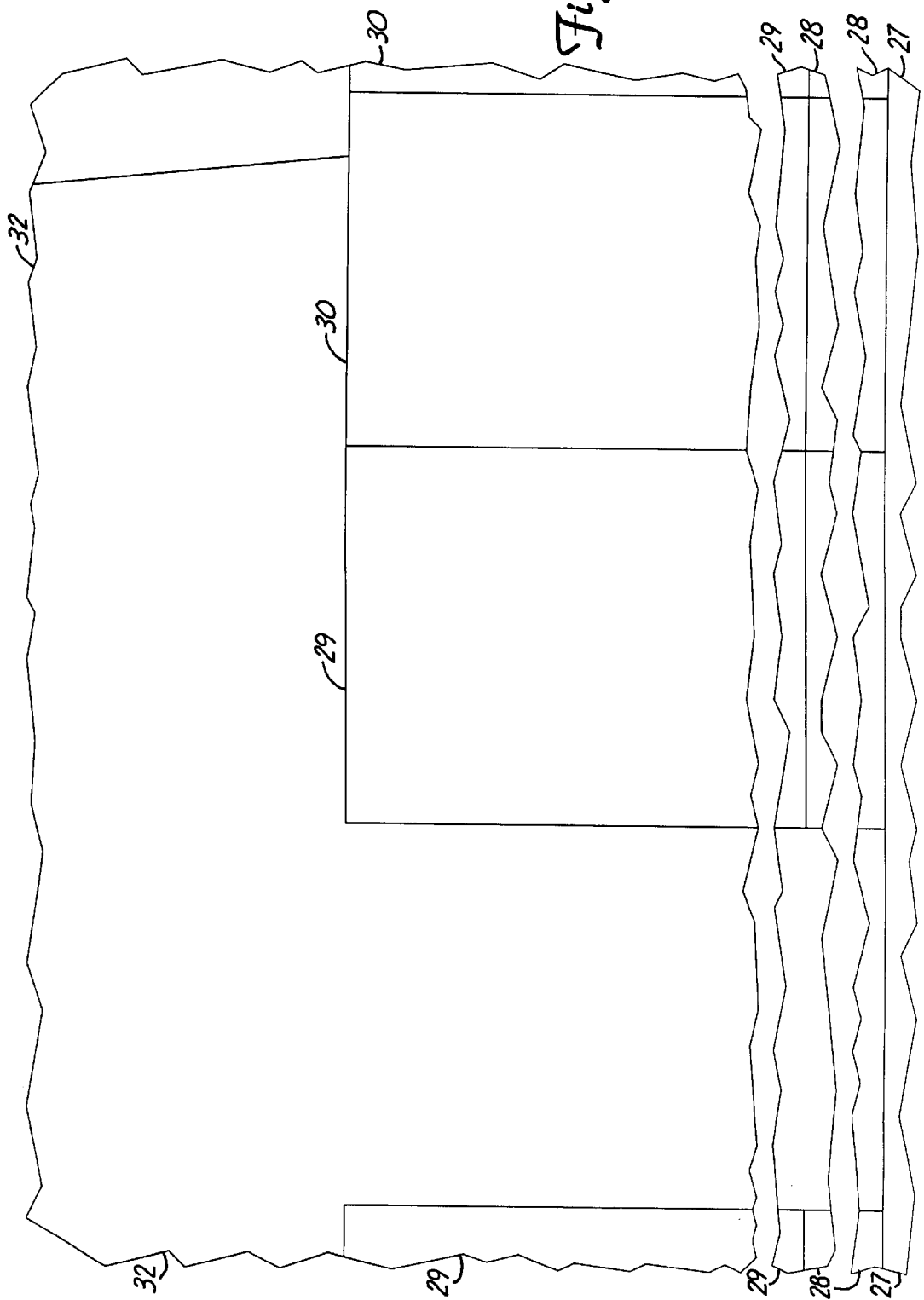

Corresponding to FIGS. 1A and 1B are FIGS. 2A, 2B, 2C, 2CC, 2CCC and 2D which are layer diagrams of corresponding portions of the structures shown in FIGS. 1A and 1B as marked in FIG. 1B by section lines in all instances except FIG. 2D. These layer diagrams give an indication of the structural layers leading to the structures shown in FIGS. 1A and 1B but are not true cross-section views in that many dimensions are exaggerated or reduced for purposes of clarity. FIG. 2CC shares the same section line with FIG. 2C but is directly above that figure. Similarly, FIG. 2CCC shares the same section line with FIGS. 2C and 2CC but again is directly above FIG. 2CC. FIG. 2D is a layer diagram from the same signal isolator shown in FIG. 1A but of a portion not shown there.

As indicated above, the current sensing structure is typically provided on a semiconductor chip, 10, having suitable operating circuitry for the sensor provided therein. A relatively smooth electrically insulating layer, 11, typically of silicon dioxide, is provided over a first metalization interconnection network, 12, typically of aluminum alloyed with 0.5% copper, to form a part of an upper surface, 13, of semiconductor chip 10 after the providing thereon of the second and final chip 10 metalization. This second, or final monolithic integrated circuit metalization, provides a metalization interconnection network, 14, typically also of aluminum alloyed with 0.5% copper, both of these interconnection networks being formed using known integrated circuit fabrication methods. Chip 10 metalization interconnection networks 12 and 14 are provided in and on chip 10 for interconnecting the integrated circuit components provided below in that chip and also for interconnecting some of the isolator circuit components provided above.

Portions of layer 11 and portions of interconnection network 14 directly support thereon a "pinned" current sensor "sandwich" structure on a metal base. This structure comprises a pair of ferromagnetic thin-film layers that are separated from one another by a nonmagnetic, electrically conductive intermediate layer all supported on a metal base layer, and on which a magnetization direction maintaining layer or "pinning" layer is provided, as will be described in more detail below. These portions of layer 11 and portions of interconnection network 14 after their formation in the monolithic integrated circuit fabrication process are typically cleaned prior to providing the signal isolator components thereon by first "ashing" them, i.e. causing ionized oxygen ($O_2$) to flow thereover to cause oxidation for further cleaning provided by back sputtering for 60 seconds to remove 40 to 60 Å of those surface portions.

A compatibility base metal layer for the above indicated sensor cell "sandwich" structure is next provided on insulating layer 11 so cleaned as a further substrate portion for supporting the sensor cell "sandwich" structures to be subsequently provided. Thus, a metal deposition is made by sputtering on layer 11 a layer of primarily β-phase tantalum to cover layer 11 and metalization 14. Base metal layer is typically deposited to a thickness of 60 Å and is done for at least two purposes. The magnitude of the "giant magnetoresistive effect" in the "sandwich" structure current sensor to be formed above is increased, and material diffusion is prevented from occurring between the "sandwich" structure above and silicon dioxide layer 11 below. A "sandwich" structure base layer, 15, which will result from this tantalum layer after structure forming steps are subsequently undertaken, is shown in FIGS. 2B and 2C resulting from such steps, but it is not yet separately formed at this point in the fabrication process from the deposited layer just described.

Thereafter, the current sensor "sandwich" structure just mentioned is provided on the base metal layer beginning with the composite ferromagnetic thin-film layer followed by the intermediate layer along with magnetization direction determination layers, all initially provided through sputter deposition as the basis for forming a magnetoresistive current sensor. This multilayer structure will have a lateral direction effective resistivity which typically ranges from 9 to 11 Ω/□. In addition, the structure will typically exhibit a magnetically controlled electrical resistance change effect response in the range of 4 to 6% between the minimum effective resistance value and the maximum effective resistance value achievable under such control.

In this structure, the second layer that is provided on the first, or base, layer previously provided for the current sensor structure is a composite ferromagnetic thin-film layer sputter deposited onto the base metal layer, the result being shown in FIGS. 2B and 2C after the subsequent structure forming steps indicated above. A first stratum, 16, of this composite ferromagnetic thin-film layer is formed of a NiFeCo alloy of 65% nickel, 15% iron and 20% cobalt deposited to a thickness of 45 Å, which has a magnetic saturation induction of typically about 12,000 Gauss, and this process results in the deposited film having a face-centered cubic structure. The deposition of this layer occurs in the presence of an external magnetic field in the plane of the film, typically oriented in a direction parallel to the direction of primary extent of, or the long (vertical) sides of, the crenelated current sensors shown in FIG. 1A to obtain a "squared up" electrical resistance versus external applied field characteristic hysteresis loop. This fabrication magnetic field will leave the easy axis of the stratum film similarly directed. In obtaining a canted loop, on the other hand, one option is to instead deposit this layer in the presence of an external magnetic field in the plane of the film oriented have the resulting easy axis of the stratum film directed perpendicular to the direction of primary extent of, or the long (vertical) sides of, the crenelated current sensors shown in FIG. 1A.

A second stratum, 17, is also provided in a sputter deposition step in the presence of a similarly directed easy axis orienting magnetic field to that used in forming stratum 16. Second stratum 13 is a CoFe alloy formed of 5% iron and 95% cobalt to a thickness of 15 Å resulting in this material having a magnetic saturation induction of approximately 15,000 Gauss which is a higher value than that of the magnetic saturation induction of first stratum 16. This higher saturation material is provided adjacent the intermediate layer, which is the next layer to be formed, to thereby obtain a greater magnetically controlled resistance change effect, but the lower saturation value in stratum 16 is provided to keep the composite film more sensitive to smaller fields than it would be in its absence so as to leave the entire layer formed as stratum 17. These strata are separately shown in FIGS. 2B and 2C as they result from subsequent structure forming steps.

Thereafter, an intermediate layer, 18, is provided by sputter deposition onto layer 17, this intermediate layer being a nonmagnetic electrical conductor. Layer 18 is formed typically by sputter depositing 40 Å of copper onto layer 17. The result after the subsequent structure forming steps is shown in both FIGS. 2B and 2C.

The provision of intermediate layer 18 is followed by providing a hard ferromagnetic thin-film layer on layer 18. This ferromagnetic thin-film layer is provided to have a net layer magnetization that, when fixed in orientation in the finally formed structure, will resist rotation, and certainly resist firmly any rotation that could be sufficient to lead to a reversal in its orientation as a result of expected externally applied magnetic fields. Thus, for the finally formed sensing structure, the magnetization of this ferromagnetic thin-film layer will appear fixed in its orientation in the device, i.e. "pinned" in a direction relative to the finally formed structure which will be parallel to the direction the current sensor is intended to sense external magnetic fields generated by currents in the input conductor or conductor coil during use in the resulting signal isolator, i.e. perpendicular to the direction of extent thereover of the input conductor.

This hard ferromagnetic thin-film layer is formed by sputter deposition of a ferromagnetic layer, 19, of CoFe comprising 95% cobalt and 5% iron to a thickness of 40 Å which is deposited on layer 18 in the presence of an easy axis direction determination magnetic field which is substantially aligned with the easy axis direction of the composite ferromagnetic layer formed of strata 16 and 17 to obtain a "squared up" hysteresis loop but substantially perpendicular thereto for a canted loop. This layer is shown in FIGS. 2B and 2C as it will result after the subsequent structure forming steps. However, the magnetization direction in this magnetically hard layer by itself is not very strongly fixed in any direction because of the relatively weak anisotropy exhibited by a CoFe layer.

Thus, a further antiferromagnetic material "pinning" layer exhibiting a substantial magnetic anisotropy must be deposited on layer 19 to firmly set the magnetization direction of hard layer 19 in the direction chosen therefor either aligned with, or perpendicular to, the easy axes in ferromagnetic layers 16 and 17 as indicated above. Such a layer has a firmly fixed magnetization direction which, through exchange coupling to layer 19, strongly fixes the direction of magnetization of that layer also. The result is an antiferromagnetic layer coupled strongly to magnetically hard layer 19 which also provides a high magnetic inductance material layer with a corresponding substantial spin polarization against barrier layer 18. Hence, a IrMn pinning layer, 20, of 20% iridium and 80% manganese is sputter deposited onto layer 19 to a thickness of 100 Å in the presence of a magnetization axis determination magnetic field aligned with, or perpendicular to, the fields used in forming ferromagnetic layers 16 and 17 as desired. Alternatively, pinning layer 20 can be formed using FeMn, NiMn, PtMn, PtRhMn or PtRuMn or some other antiferromagnetic materials. Pinning layer 20 is shown in FIGS. 2B and 2C as it will result after the subsequent structure forming steps.

After completing this antiferromagnetic magnetization pinning arrangement using these magnetization direction determination layers, a 100 Å layer of β-phase tantalum is sputter deposited on pinning layer 18 to passivate and to protect the current sensor structure therebelow, and to allow electrical connections thereto for circuit purposes. The resulting layer, 21, is shown in FIGS. 2B and 2C as it will result after the subsequent structure forming steps.

Because surface cleanliness of a layer resulting from a completed deposition prior to forming the next layer in sequence thereon has a significant effect on surface roughness of this subsequent layer after its deposition, the deposition of layers 11 to this point, i.e. through layer 19, are typically done in a sputter deposition chamber one after the other over which steps a vacuum is maintained without an intervening exposure to the atmosphere occurring which could allow surface contamination or oxidation to occur. This procedure also allows for more precise control over the layer thicknesses since no surface cleaning steps are needed prior to depositing the next layer which would introduce thickness variations with a small but more or less random portion. If desired, wafers which are completed to this point in the sensor fabrication process can be removed form the sputtering deposition chamber and, for example, stored to complete the remaining steps in the fabrication process at a later time.

Next in this fabrication process, a further layer, 22, is deposited onto layer 21 to a thickness of 100 Å to provide an etching termination layer, or stop, for subsequent etching steps. Layer 21 is first sputter cleaned which removes around 50 Å thereof. Then, layer 22 is sputter deposited on cleaned layer 21 as a chrome silicon layer with 40% chrome and 60% silicon to serve as an etch stop for the subsequent etching of a layer to be provided thereover as a milling mask. Once more, this layer is shown in FIGS. 2B and 2C as it will result after the subsequent structure forming steps.

The mentioned milling mask layer is formed of silicon nitride and is next sputter deposited onto layer 22 to a depth of 1500 Å to there be prepared for use as a milling mask, but this layer is not shown in FIGS. 2B and 2C because its remnants will be incorporated in a further insulating layer to be provided later. On this silicon nitride mask layer, photoresist is deposited and patterned with a photomask using well known monolithic integrated circuit fabrication methods in such a way as to form the remaining portions of the photoresist after its etching into an etching mask of a pattern desired to be imposed on the nitride layer therebelow for purposes of converting it to a milling mask. The nitride layer is to be shaped to its final pattern that follows the photoresist pattern by leaving the intended masking portions of the silicon nitride layer below the remaining masking portions of the photoresist after etching through the photoresist pattern. This final masking pattern formed by the remaining portions of the silicon nitride is to result, after milling through surfaces not protected by the remaining nitride to remove the exposed ferromagnetic, antiferromagnetic and nonmagnetic layers therebelow, in four separated current sensor substructures. These substructures are to serve as members of a current sensor bridge circuit with each such substructure having a pinned electrode in a "sandwich" construction with intermediate layer 14 and composite layer ferromagnetic strata 16 and 17.

Reactive ion etching with sulfur hexofluoride is used with the patterned photoresist to remove the exposed portions of the silicon nitride masking layer down to chrome silicon layer 20 serving as an etch stop. The remaining portions of the silicon nitride layer protected by the photoresist serve as the above mentioned milling mask for the subsequent ion milling step. This step in a 45° ion mill removes the exposed portions of chrome silicon layer 22, and thereafter, also the then exposed portions of tantalum layer 21, the next exposed portions of pinning layer 20, the next exposed portions of hard ferromagnetic thin-film layer 19, the next exposed intermediate layer 18, the next exposed composite ferromagnetic layer having strata 16 and 17, and finally then exposed base metal layer 15 to thereby form four crenelated current sensor substructures, 23A, 23B, 23C and 23D as "giant magnetoresistive effect" magnetoresistors, and to similarly form interconnecting lead structures, 24A, 24B, 24C, 24D, 24E, 24F, 24G and 24H, that are formed integrally with the current sensor substructures as shown in FIG. 1A and in part in FIG. 1B.

Current sensor interconnecting lead structures 24A and 24D are directly deposited on corresponding portions of metalization interconnecting network 14 that are part of a continuous network segment so as to form a direct electrical interconnection between crenelated current sensor substructures 23B and 23D as can be seen in FIG. 1A. Current sensor interconnecting lead structures 24B and 24C are directly deposited on corresponding portions of metalization interconnecting network 14 which are not part of a continuous network segment, but which are instead joined to one another by a continuous segment of metalization interconnecting network 12 connected to these network 14 portions by metal leads extending through via access openings in insulating layer 11. These interconnected portions of networks 12 and 14 thus form a direct electrical interconnection between crenelated current sensor substructures 23A and 23C as again can be seen in FIG. 1A.

Current sensor interconnecting lead structure 24E directly electrically interconnects crenelated current sensor substructures 23A and 23B and provides an interconnection path to a further portion of metalization interconnecting network 14 which in turn provides an interconnection path to a bonding pad at which positive voltage from a positive voltage supply is to be provided for circuit operation. Current sensor interconnecting lead structure 24F directly electrically interconnects crenelated current sensor substructures 23C and 23D and also provides an interconnection path to a further portion of metalization interconnecting network 14 which in turn provides an interconnection path to a bonding pad at which the ground voltage reference for the current sensor circuit is provided, and to which the ground reference for the circuit in monolithic integrated circuit chip 10 is also connected to aid in eliminating or reducing parasitic coupling from the input conductor coil to be subsequently fabricated and current sensor bridge circuit. This bonding pad interconnection arrangement is shown in FIG. 2D.

Current sensor interconnecting lead structure 24G is formed with and so directly electrically interconnected current sensor interconnecting lead structure 24C at the interconnection or juncture of crenelated current sensor substructures 23A and 23C forming a current sensor bridge circuit output. Interconnecting lead structure 24G also provides an interconnection path to a further portion of metalization interconnecting network 14 which in turn provides an interconnection path to an input of the amplifier, or receiver, to which the current sensor bridge circuit output is connected for amplifying bridge circuit output signals. Similarly, current sensor interconnecting lead structure 24H is formed with and so directly electrically interconnected current sensor interconnecting lead structure 24D at the interconnection or juncture of crenelated current sensor substructures 23B and 23D forming a current sensor bridge circuit output. Interconnecting lead structure 24H in the same manner also provides an interconnection path to a further portion of metalization interconnecting network 14 which in turn provides an interconnection path to another input of the amplifier, or receiver, to which the current sensor bridge circuit output is connected for amplifying bridge circuit output signals.

Following the completion of current sensor substructures 23A, B, C and D, and the associated current sensor interconnection lead structures, another layer of silicon nitride is sputter deposited over those structures and the exposed portions of insulating layer 11 and metalization interconnecting network 14 to a thickness of 3000 Å to form a further insulating layer to protect these structures and chip 10. Photoresist is provided over this insulating layer as an etching mask and patterned to provide openings therethrough at locations where current sensor interconnection lead structures 24 are disposed on portions of metalization interconnecting network 14. A following reactive ion etching step removes the exposed silicon nitride. The resulting silicon nitride layer, 25, is shown in FIGS. 2A, 2B, 2C and 2D though as it appears following a further fabrication step in the instance of FIG. 2D.

Sputter deposition is then used to deposit 3000 Å thick layer of β-phase tantalum onto silicon nitride layer 25, and onto exposed portions of current sensor interconnection lead structures 24 and metalization interconnecting network 14. Photoresist is provided over this tantalum layer to be formed into an etching mask, and patterned for this purpose so as to leave portions thereof at locations where the current sensor interconnection lead structures 24 are disposed on portions of metalization interconnecting network 14 so that tantalum will remain deposited on both portions of the current sensor interconnection lead structures 24 and portions of metalization interconnecting network 14 at those locations where the former is disposed on the latter to improve the electrical interconnection therebetween as well as over adjacent portions of silicon nitride layer 25. In addition, the photoresist is patterned to leave portions thereof at locations on silicon nitride layer 25 over all four crenelated current sensor substructures 23A, 23B, 23C and 23D to serve as the electric field interrupter described above to shunt to ground the parasitic capacitances which would otherwise extend between these substructures and the input conductor coil to be subsequently provided.

Of course, if the parasitic capacitances are too small to couple higher frequency circuit variables from the input conductor to the current sensor in magnitudes sufficient to risk disruption of the circuitry connected to the output of the current sensor, this provision of an electric field interrupter can be skipped thereby omitting such a structure from the signal isolator. Similarly, if the electrical conduction between portions of the current sensor interconnection lead structures 24 and portions of metalization interconnecting network 14 where the form is disposed on the latter is deemed sufficient, the provision of tantalum at those locations can also be omitted.

If silicon layer 25 has been opened at locations where current sensor interconnection lead structures 24 are disposed on portions of metalization interconnecting network 14 and tantalum has been deposited, an etching using hydrofluoric acid is undertaken to remove the unmasked portions of the tantalum. A portion of a resulting interconnection improvement tantalum deposition remainder or electrical contact enhancer, 26A, is shown in FIG. 2B. A portion of the resulting electric field interrupter structure, 26B, is shown in FIG. 2C. Similar designations are used for like structures in FIGS. 1A and 1B, but there they are shown in outline form only to avoid covering the details of structures therebelow. The outline form is based on using a dashed line as the outline indicator comprising long dashes separated by two short dashes.

In the upper right corner of FIG. 1A, electric field interrupter 26B also serves to improve the electrical interconnection between current sensor interconnecting lead structure 24F and further portion of metalization interconnecting network 14 as described above rather than using a separate tantalum interconnection improvement deposit remainder. Since this portion of metalization interconnecting network 14 leads to a bonding pad at which the ground voltage reference for the current sensor circuit is provided and to which the ground reference for the circuit in monolithic integrated circuit chip 10 is provided as described above, electric field interrupter 26B is also connected to these ground references at this location.

Upon completion of the tantalum electrical contact enhancers 26A and electric field interrupter 26B, a 7 μm positive photoresist layer is coated over these tantalum structures and over the exposed portions of silicon nitride layer 25. This polymer layer is patterned to expose those portions of metalization interconnecting network 14 where bonding pads are to be formed for the purpose of allowing external interconnection with that network for operation of the monolithic integrated circuit and the isolator circuit such as interconnections from a supply of positive voltage and from a supply of ground reference voltage. After patterning, the remaining portions of the photoresist are given a hard cured by heating through either a convection flow or on a hot plate sufficiently to cause the patterned resist to reach a temperature in excess of 200° C. A cured, patterned photoresist layer, 27, results which serves as a dielectric, or electrical insulating material, between the input conductor coil to be subsequently provided and electric field interrupter 26B, and also between those four crenelated current sensor substructures 23A, 23B 23C and 23D provided beneath silicon nitride layer 25 and electric field interrupter 26B. Portions of polymer dielectric layer 27 are shown in FIGS. 2A, 2B, 2C, 2CC and 2D.

The polymer material chosen for layer 27 must be chosen with some care. The temperature at which it can be hard cured, or cross-linked, must be low enough to avoid damaging crenelated current sensor substructures 23A, 23B 23C and 23D. In addition, the material of layer 27 should provide improved planarization of the resulting surface of this layer over that of the surface on which it is formed, and it should adhere well to that latter surface. The resulting material in layer 27 should exhibit a high breakdown voltage with low water absorption in support of this requirement, and should further exhibit sufficient mechanical stiffness to permit wire bonding to the bonding pads of the input coil to be provided thereover (with the aid of stiffening bases to be provided under those pads). The glass transition temperature of the material in layer 27 must be sufficiently high to exceed temperatures reached during thermosonic bonding.

One suitable photoresist for use in forming dielectric polymer layer 27 is high solids content Novalac AZ P4903 positive photoresist supplied by AZ Electronic Materials Division of Clariant Corporation in Sunnyvale, Calif. Another is B-staged bisbenzocyclobutene (BCB) available from Dow Chemical Company in Midland, Mich. under the trade name CYCLOTENE in both photodefinable and non-photodefinable versions.

A mechanically stiff layer is next needed to be provided on deformable polymer dielectric layer 27 to provide a firmer base for supporting the input conductor coil to be next provided and the bonding pads integral therewith that allow external interconnection to be made through wire bonding to this input conductor coil, as well as adhering them to layer 27. Such a stiffening layer allows for successful wire bonding by limiting the movement and deformation of the bonding pad which would otherwise occur as layer 27 thereunder deforms during the wire bonding operation under the pressure applied in that operation. Although various glass-like, nonmetallic materials commonly used in monolithic integrated circuit fabrication could be used for this stiffening support layer such as silicon dioxide, aluminum oxide or aluminum nitride, or further nonmetallic refractory compounds, silicon nitride is provided here by sputter deposition to a thickness of 3000 Å. Directly thereafter, a 1.4 μm layer of unalloyed aluminum is sputter deposited onto the previously deposited silicon nitride stiffening layer from which to form the input conductor coil and its bonding pads.

Photoresist is then provided over this aluminum layer to be formed into an etching mask, and patterned for this purpose so as to leave portions thereof at locations where the input conductor coil and the bonding pads for this coil are to result. Reactive ion etching, using a mixture of chlorine, boron trichloride and nitrogen, is used to remove the unwanted portions of the aluminum so as to leave the coil and its integrally formed bonding pads.

Thereafter, photoresist is again provided over the remaining portions of the coil and bonding pad metal to again be formed into an etching mask, and this photoresist is patterned so as to leave those metal portions covered. Reactive ion etching with sulphur hexofluoride is then used to remove the exposed portions of the stiffening nitride layer, and to also remove those portions of silicon nitride layer 25 remaining over that portion of metalization interconnection layer 14 at which bonding pads are to be provided for external interconnection thereto. The remaining portions of the stiffening silicon nitride layer after this etching form silicon nitride metal support bases, 28. The remaining portions of the aluminum on bases 28 form the conductor comprising input conductor coil 29 and the bonding pads, 30, integrally formed therewith as shown in FIG. 2CC. In addition, via openings, 31, are provided in silicon nitride layer 25 at selected locations to expose corresponding portions of metalization interconnecting network 14 for purposes of permitting bonding pad interconnection as described above, one such via being shown in FIG. 2D.

Layer 28 is shown broken apart in FIG. 2CC with a vertically central portion of it omitted because of its relatively greater thickness than other structures present. Similarly, coil 29 is also shown broken apart in FIG. 2CC with a vertically central portion of it omitted because, again, of its relatively greater thickness. In addition, coil 29 is shown in FIGS. 1A and 1B along with bonding pads 30 and the integral interconnections therebetween. In FIG. 1A, the turns of coil 29 can be seen each supported on bases 28 on polymer dielectric layer 27 extending over the same corresponding portions of each of crenelated current sensor substructures 23A, 23B 23C and 23D and crossing them at the same angle, substantially 90°, to form a very symmetrical geometrical relationship therebetween and to result in a "squared up" electrical resistance versus external applied field hysteresis loop.

FIG. 1A would look substantially the same for a current sensor providing a canted loop but, in one option for doing so, the easy axes of strata 16 and 17 would extend along the widths of the portions of primary extent of each of crenelated current sensor substructures 23A, 23B 23C and 23D parallel to the directions of primary extent of coil 29 thereover. Alternatively, the easy axes of strata 16 and 17 can extend along the lengths of the portions of primary extent of each of crenelated current sensor substructures 23A, 23B 23C and 23D with pinned axis of hard ferromagnetic layer 19 and the pinning axis of pinning layer 20 extending along the widths of the portions of primary extent of each of crenelated current sensor substructures 23A, 23B 23C and 23D. In this latter option, the geometry of coil 29 would have to change to have its directions of primary extent parallel the directions of primary extent of each of crenelated current sensor substructures 23A, 23B 23C and 23D to generate magnetic fields along these pinning and pinned axes.

As indicated above, the conductor in coil 29 is of unalloyed aluminum, and it is also of smaller dimension than necessary to avoid substantial electromigration of the metal therein if the current values occurring therein at the peaks of the current excursions corresponding to digital data pulses were typical. However, because the shortness of these excursions, and because the polarities of the current excursions at the leading and trailing edges of logic value voltage pulses in the digital data input signal alternate, such metal electromigration does not occur to an unacceptable extent.

A further polymer layer, provided as a passivation dielectric layer, is then coated to a thickness of 3 μm on input conductor coil 29, bonding pads and bonding pad interconnects 30, the exposed sides of stiffening bases 28, the exposed surfaces of polymer dielectric layer 27, and the exposed surfaces of metalization interconnection network 14 at locations of circuit operation bonding pads. Again, this photoresist coating is patterned so as to expose portions of input conductor bonding pads 30 and those portions of metalization interconnection network 14 where such further bonding pads are to be provided. The remaining portions of this polymer dielectric layer after patterning are then hard cured by heating them in a convection flow or on a hot plate sufficiently to reach a temperature exceeding 200° C. Again, a photoresist like that used for layer 27 is used for this passivation layer. Polymer dielectric passivation layer 32 is shown in FIG. 2CC and in FIG. 2CCC.

In some instances, additional metal may be desired to be added to the bonding pad locations, both at the circuit operation bonding pad locations and at bonding pads 30 for the input conductor coil, to stiffen them for subsequent wire bonding. With only coil bonding pad locations and monolithic integrated circuit and isolator circuit operational bonding pad locations exposed, aluminum alloyed with 0.5% copper is sputter deposited over these exposed bonding pad locations and over passivation layer 32. Photoresist is then provided over this aluminum layer to be formed into an etching mask, and is patterned for this purpose so as to leave portions thereof at locations where the bonding pads are to be thickened. A wet etch is used comprising an a mix of phosphoric, ascetic and nitric acids to remove the aluminum where not covered by the photoresist remaining after its patterning. Such additional metal, 33, is seen in via opening 31 in FIG. 2D.

With again only coil bonding pad locations and monolithic integrated circuit and isolator circuit operational bonding pad locations exposed, although with added metal if provided, a seed layer for the plating of a magnetic shield is deposited to a thickness of 2000 Å over those locations and over the exposed portions of passivation layer 32. This seed layer is formed by sputter depositing an alloy of Ni Fe Co in concentrations of 65%, 15%, and 20%, respectively. This seed layer is then coated with a layer of photoresist of around 10 μm thickness which is then exposed and developed to define the regions where the shield structures are to be plated, i.e. over coil 29 where that coil crosses over crenelated current sensor substructures 23A, 23B, 23C and 23D. Electroplating is then used to plate an alloy of NiFe as a magnetic shield to a thickness of 10 μm at these locations with the composition being 80% Ni and 20% Fe.

Thereafter, the photoresist which has served as a plating mold is removed in an acetone solvent bath. Finally, portions of the seed layer exposed by the removal of the photoresist plating mold are then removed using a 45° ion mill to thereby leave seed layer portions, 34, as a base under a pair of magnetic shields, 35, as shown in FIG. 2CCC. Shields 35 are also seen in FIGS. 1A and 1B, but again they are shown there in outline form only to avoid covering the details of structures therebelow. The outline form is based on using a dashed line as the outline indicator comprising alternating long and short dashes.

The resulting signal isolator structure shown in FIG. 1A can be seen to have the long sides of each of crenelated current sensor substructures 23A, 23B, 23C and 23D substantially perpendicular to the direction of the electrical conductor passing repeatedly thereover forming input conductor coil 29. Thus, currents in input conductor coil 29, in generating magnetic fields which are perpendicular to the direction of extent of this electrical conductor forming that coil, also provides these fields parallel to the easy axis of composite ferromagnetic thin-film layer formed by strata 16 and 17 extending along the long sides of each of crenelated current sensor substructure.

Current sensor interconnecting lead structures 24A and 24D directly connected by metalization interconnecting network 14 place crenelated current sensor substructures 23B and 23D as a pair electrically in series with one another between voltage supply current sensor interconnecting lead structures 24E and 24F. Similarly, current sensor interconnecting lead structures 24B and 24C directly connected by metalization interconnecting networks 12 and 14 place crenelated current sensor substructures 23A and 23C as a pair electrically in series with one another between voltage supply current sensor interconnecting lead structures 24E and 24F. This results in currents in input conductor coil 29 flowing in opposite directions over each member of a pair. Therefore, these two pairs of series connected current sensor crenelated resistors have each member in a pair experience magnetic fields generated by a current in input conductor coil 29 oriented in opposite directions with respect to each member of a pair to force the two members of a pair to opposite extreme resistance states, and thereby providing a differential voltage output signal at current sensor interconnecting lead structures 24G and 24H in the presence of an operating current being provided between supply current sensor interconnecting lead structures 24E and 24F.

This current sensor output signal is first provided to an amplifier in the monolithic integrated circuit in chip 10 which, for a bridge circuit, is typically a differential amplifier and, as amplified, this signal is provided to subsequent signal processing circuitry. In a situation in which crenelated current sensor substructures 23A, 23B, 23C and 23D are formed to provide a substructure electrical resistance versus applied external field characteristic in the form of a "squared up" hysteresis loop, this differential amplifier might be involved with a comparator. In a situation in which crenelated current sensor substructures 23A, 23B, 23C and 23D are formed to provide a substructure electrical resistance versus applied external field characteristic in the form of a canted hysteresis loop, this differential amplifier might be involved with a data latch.

Figure 3:
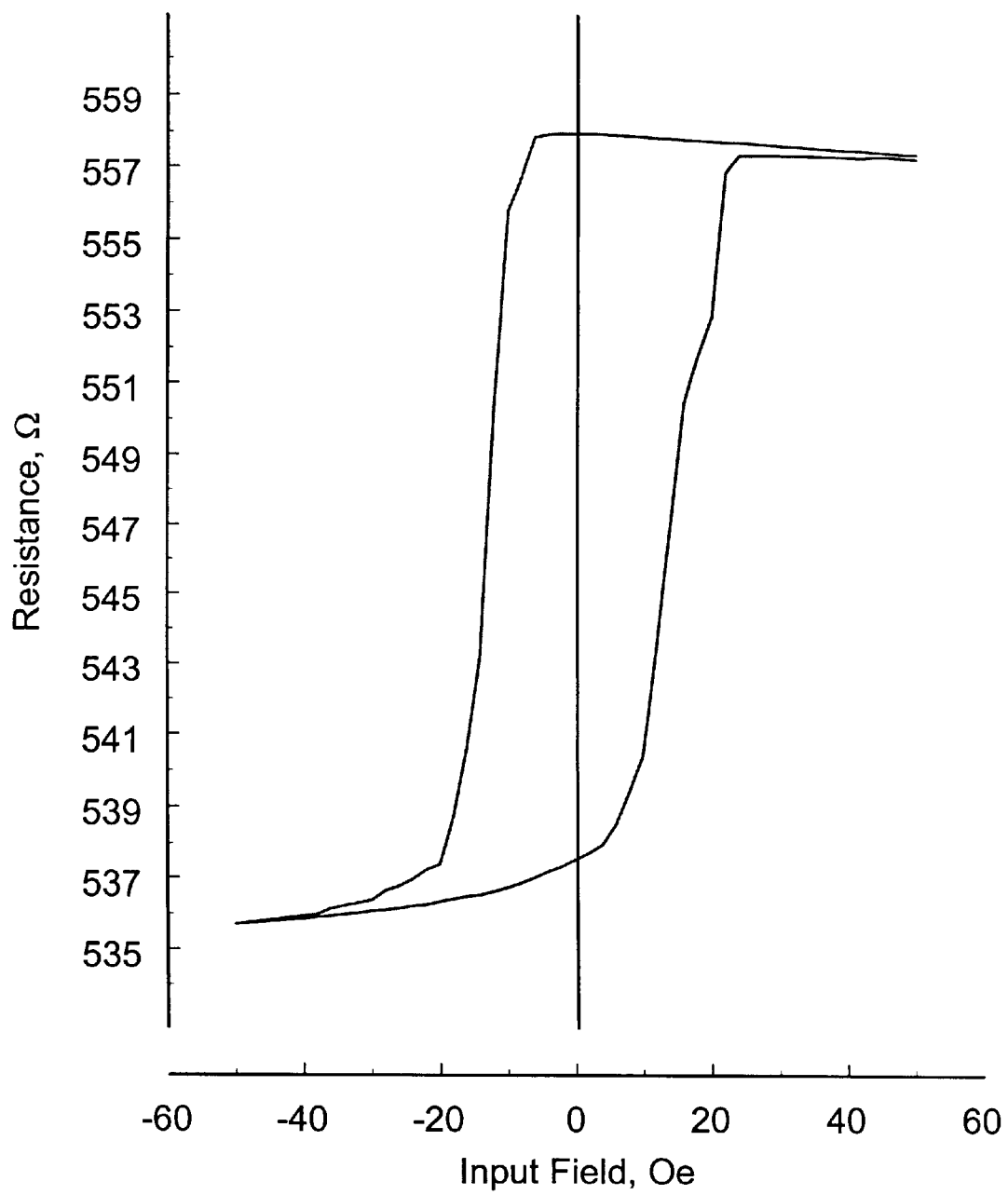
FIG. 3 shows a characteristic of a structure like that represented in FIGS. 1 and 2.

The completed digital isolator just described has each of crenelated current sensor substructures 23A, 23B, 23C and 23D exhibiting a substructure electrical resistance versus applied external field characteristic as seen in the graph shown in FIG. 3 in the instance of providing a characteristic having the form of a "squared up" hysteresis loop. An orientation of the magnetization direction of pinning layer 20 in the opposite direction will have the effect of rotating this hysteresis loop about the vertical resistance axis of the plot shown centered over the zero value on the input field axis without any resistance values displayed therewith to avoid obscuring the plot. A supplementary vertical resistance axis having resistance values displayed therewith is shown in this graph to the left of the characteristic plot. A canted loop would have sides at a greater angle with respect to the vertical resistance axis of the plot and significantly closer together.

An input signal converter for converting CMOS technology digital logic circuitry signals to short current excursions at beginnings and ends of logic value pulses generated in such circuitry is shown in FIG. 4A using such CMOS technology monolithic integrated circuitry although all bipolar and bipolar CMOS (BICMOS) technologies monolithic integrated circuits can alternatively be used. A positive voltage supply is connected in operation between a positive supply terminal, 40, and a ground reference terminal, 41. Logic signals with selected logic value voltage magnitudes are supplied from a source thereof, or various sources thereof, each of which is to be electrically isolated from the current sensor and the subsequent circuitry connected thereto. An example of a portion of such a signal is shown in FIG. 4B in a graph of $v_{42}$ versus time, t. Such logic signals from such sources are supplied to a signal input, 42, through a current limiting resistor, 43, to the input of a hysteretic, buffered output inverter, 44. The difference in input signal magnitude switching thresholds for switching inverter 44 encountered in switching from one inverter output logic state to the other reduces the risk of unwanted switchings in the output logic states of that inverter due to noise accompanying the input signal thereto.

Inverter 44, starting from terminal 40, has an input transistor stack with the source terminating region of a p-channel metal-oxide-semiconductor field-effect transistor (MOSFET) in this stack connected to that terminal and its drain terminating region connected to the source of another such transistor with its drain, in turn, connected to the drain of an n-channel MOSFET to form the inverter output. The source of that n-channel MOSFET is connected to the drain of a further n-channel MOSFET having its source connected to reference terminal 41. The gates of all four transistors in the stack are connected in common form the inverter input. A feedback p-channel MOSFET is provided at its terminating regions between terminal 41 and the junction of the stack p-channel MOSFET's, and a n-channel MOSFET is provided at its terminating regions between terminal 40 and the junction of the stack n-channel MOSFET's. The gates of the feedback transistors are both connected to the inverter output. These feedback transistors allow setting of the switching points of the stack resistors to provide different switching thresholds for switching the inverter output to a high logic state versus switching that output to a low logic state.

Also, the input gates of the input transistor stack in hysteretic inverter 44 are protected from excessive magnitude voltages possibly occurring in the input signal thereto, due to electrical noise or other causes, by a pair of MOSFET's each connected as a clamping diode between input 42 and a corresponding one of supply terminal 40 and reference terminal 41. A p-channel MOSFET, 45, has one terminating region thereof connected to terminal 40 and the other connected to input 42 with its gate also connected through a resistor, 46, to terminal 40. Similarly, a n-channel MOSFET, 47, has one terminating region thereof connected to terminal 41 and the other connected to input 42 with its gate also connected through a resistor, 48, to terminal 41. Thus, input signal magnitudes are clamped to remain in a range between a MOSFET threshold voltage above the voltage supplied to terminal 40 and a MOSFET threshold voltage below the ground reference voltage on terminal 40.

A further inverter, 49, a standard configuration CMOS inverter, has its input connected to the output of hysteretic inverter 44. Inverter 49 has a p-channel MOSFET and a n-channel MOSFET therein with their drains commonly connected to one another to form its output and their gates commonly connected to one another to form its input, and their sources connected to terminals 40 and 41, respectively. Thus, the output logic signal from inverter 45 corresponding to the input signal to inverter 44, based on the two successive inversions of that input signal provided by in inverters 44 and 45, substantially matches the input signal to inverter 44 although delayed by the switching delays through inverters 44 and 45. If the noise risk reduction supplied by inverter 44 is not wanted, input 42 can be disconnected from inverter 44 or the output of inverter 45 can be disconnected from the subsequent circuitry, and-input 42 in either situation connected instead directly to the input of such subsequent circuitry as indicated by the dashed line extending from resistor 43 to the input of that subsequent circuitry.

The subsequent circuitry connected to either the output of hysteretic inverter 44, or input 42 via the dashed line interconnection alternative, comprises a pair of successive CMOS standard configuration inverters, 50 and 51, and then a further CMOS standard configuration inverter, 52, in parallel with a string of further CMOS standard configuration inverters, 53 through 61. In this string of inverters, inverter 53 has an output signal matching that at the output of inverter 52. Following inverter 53 in the string are four pairs of inverters so that an even number of inversions of the signal supplied at the output of inverter 53 occur leaving the signal at the output of inverter 61 at the end of the string matching that at the output of inverter 53 but delayed by eight inverter switching times. (This delay may be increased further by adding a selected amount of capacitance into this string paralleling the input capacitance of one of the inverters such as is shown by the dashed line capacitance which can be selectively provided in parallel with the input capacitance of inverter 54.)

Figure 4:
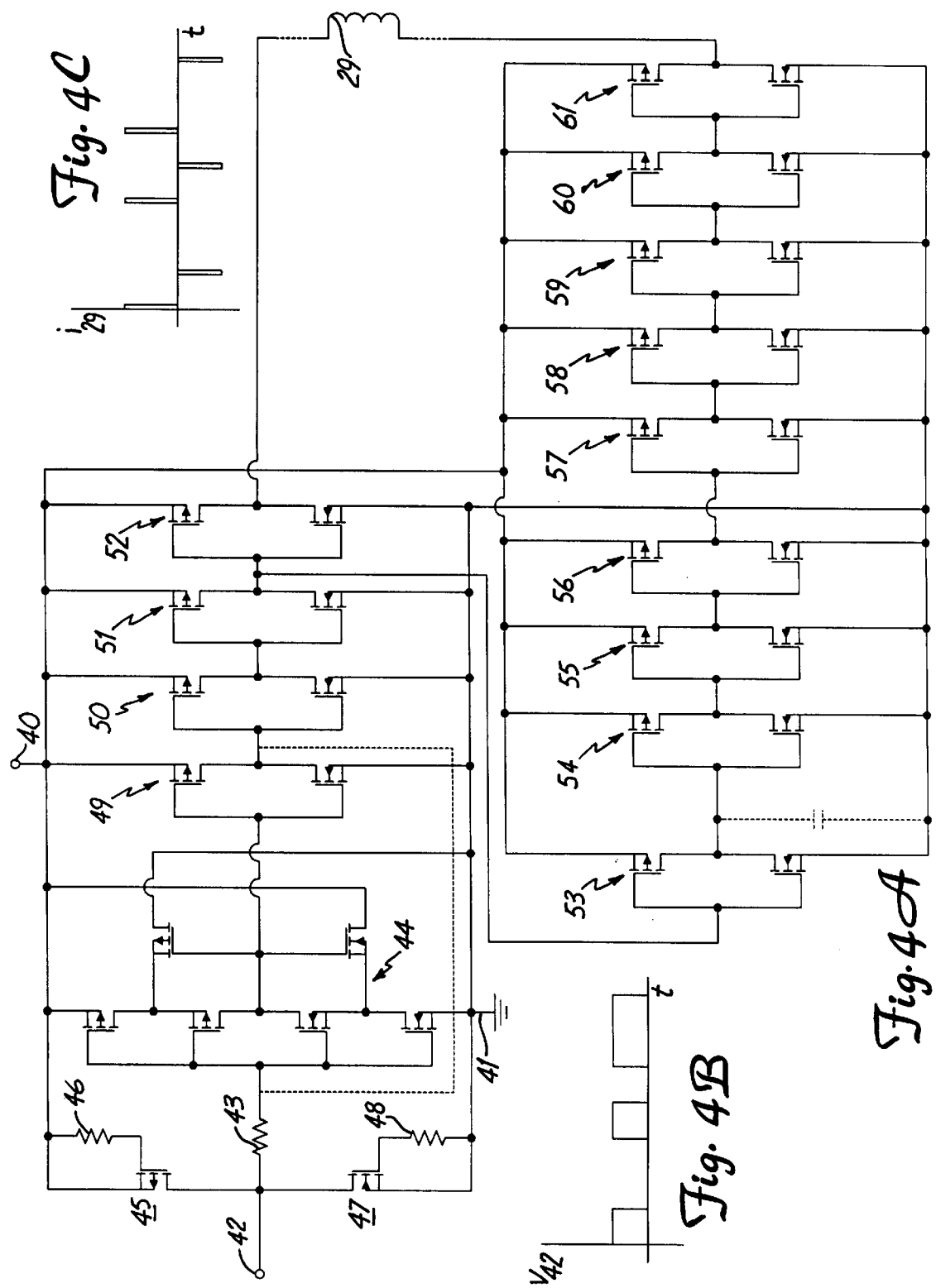
FIG. 4A shows a circuit schematic diagram of a circuit used in the present invention.
FIGS. 4B and 4C shows waveforms associated therewith.

Input conductor coil 29 is shown connected between the output of inverter 52 and the output of inverter 61 (with dashed line interruptions in these interconnections to indicate the monolithic integrated circuit in which the converter of FIG. 4 is provided is different than that in which coil 29 is provided to maintain electrical isolation between this converter circuit and coil 29, on the one hand, and crenelated current sensor substructures 23A, 23B, 23C and 23D on the other.) Thus, if the logic state at input 42 is low and a time longer than the switching propagation time through inverters 44, 49, 50 and 51 plus the switching propagation time through the string has elapsed, the outputs of both inverters 52 and 61 will be in a high logic state so that both ends of coil 29 will be essentially at the supply voltage on terminal 40 so that there is little or no current in that coil.

A change to a high logic state at input 42 will lead to a low logic state at the output of inverter 52 following the switching propagation time through inverters 44, 49, 50 and 51 so that the end of coil 29 connected thereto will be at essentially the ground reference voltage. Thus, current will begin in coil 29 directed from the output of inverter 61 to the output of inverter 52. Following the further switching propagation time through the string, the output of inverter 61 will go to a low logic state taking the end of coil 29 connected thereto to essentially the ground reference voltage and ending the current previously established in coil 29. The duration over which this current excursion occurred in coil 29 thus is set by the switching propagation time through the string which is primarily determined by the number of inverters therein and the value of any added capacitance indicated by the dashed line capacitor at the input of inverter 54.

Upon a change in the logic state on input 42 back to a low logic state, a high logic state will occur at the output of inverter 52 following the switching propagation time through inverters 44, 49, 50 and 51 so that the end of coil 29 connected thereto will be at essentially the supply voltage on terminal 40. Thus, current will begin again in coil 29 but in an opposite direction now being from the output of inverter 52 to the output of inverter 61. Following the further switching propagation time through the string, the output of inverter 61 will go to a high logic state taking the end of coil 29 connected thereto to essentially the supply voltage on terminal 40 and again end the current previously established in coil 29. The duration over which this current excursion occurred in coil 29 thus is set again by the switching propagation time through the string. The current excursions in coil 29 over time corresponding to the logic signal shown in FIG. 4B are shown in the graph of FIG. 4C of $i_{29}$ versus time.

In housing the signal isolator two monolithic integrated circuit chips, one containing the input signal converter and the other containing the input conductor or conductor coil, the current sensor bridge circuit, and the subsequent circuitry connected to the current sensor output, these chips must be kept electrically isolated from one another without direct circuit interconnections therebetween but with an exception. That exception, of course, involves the electrical conductors that are provided extending between outputs of the pulse edge current excursion generator circuit in the signal converter, such as shown in FIG. 4, formed in signal converter chip and the ends of the input conductor or conductor coil provided adjacent to the current sensor in the other chip.

Thus, for a signal isolator in an information transmission system in which the information is transmitted in just one direction through the system, these chips will typically be mounted on separated metal lead frame segments with electrical conductors, typically wire bonds extending from bonding pads electrically interconnected to the generator circuit outputs, formed by the outputs of inverters 52 and 61 in the first chip, to bonding pads 30 electrically interconnected to the ends of input conductor or conductor coil 29 in the second chip. In addition, wire bonds will extend from selected ones of the housing interconnection pins to the bonding pads in the first chip which are electrically interconnected to the circuit voltage supply and ground voltage reference terminals of the integrated circuit in the first chip, and to the signal for receiving information input signals for transmitting the information contained therein. There may also be some wire bonds connected to bonding pads connected in turn to various circuit control terminals of the circuits in the first chip.

Similarly, other wire bonds will extend form other selected ones of the housing interconnection pins to the bonding pads in the second chip which are electrically interconnected to the circuit voltage supply and ground voltage reference terminals of the integrated circuit in the second chip (again, the ground reference in this second chip is for both the integrated circuit formed in the chip and the current sensor along with its related circuitry also supported in that chip). There will also extend from a selected pin a wire bond connected to a bonding pad electrically interconnected to the output of the signal processing circuitry in the second chip connected to the output of the current sensor (or possibly to that sensor) to make available the information transmitted. Again, there may also be some wire bonds connected to bonding pads connected in turn to various circuit control terminals of the circuits in the second chip A further possibility is the use of two different signal isolators in the same system through which various kinds of information is transmitted in opposite directions through that system. Thus, two distinguishable signal isolator arrangements would be used, one to transmit information from a first source in the system to a first destination in the system and the other to transmit information from a second source in the system, possibly located at or near the first destination, to a second destination in the system possibly located at or near the first source.

However, these two signal isolator arrangements can still be conveniently provided on just two monolithic integrated circuit chips. In doing so, the first signal converter, connected to the first information source, will be provided on a first chip having its converter outputs connected by wire bonds between bonding pads to the ends of the input conductor coil on a second chip adjacent a current sensor on the second chip connected through subsequent circuitry to the first destination. Similarly, the second signal converter, connected to the second information source, is provided on the second chip sharing a common voltage supply and a common ground voltage reference with the second chip current sensor and subsequent circuitry just mentioned. This second signal converter has its converter outputs connected by wire bonds between bonding pads to the ends of the input conductor coil on the first chip adjacent a current sensor on the first chip connected through subsequent circuitry to a second destination. Again, the first signal converter is provided on the first chip sharing a common voltage supply and a common ground voltage reference with the first chip current sensor and subsequent circuitry.

Figure 5:
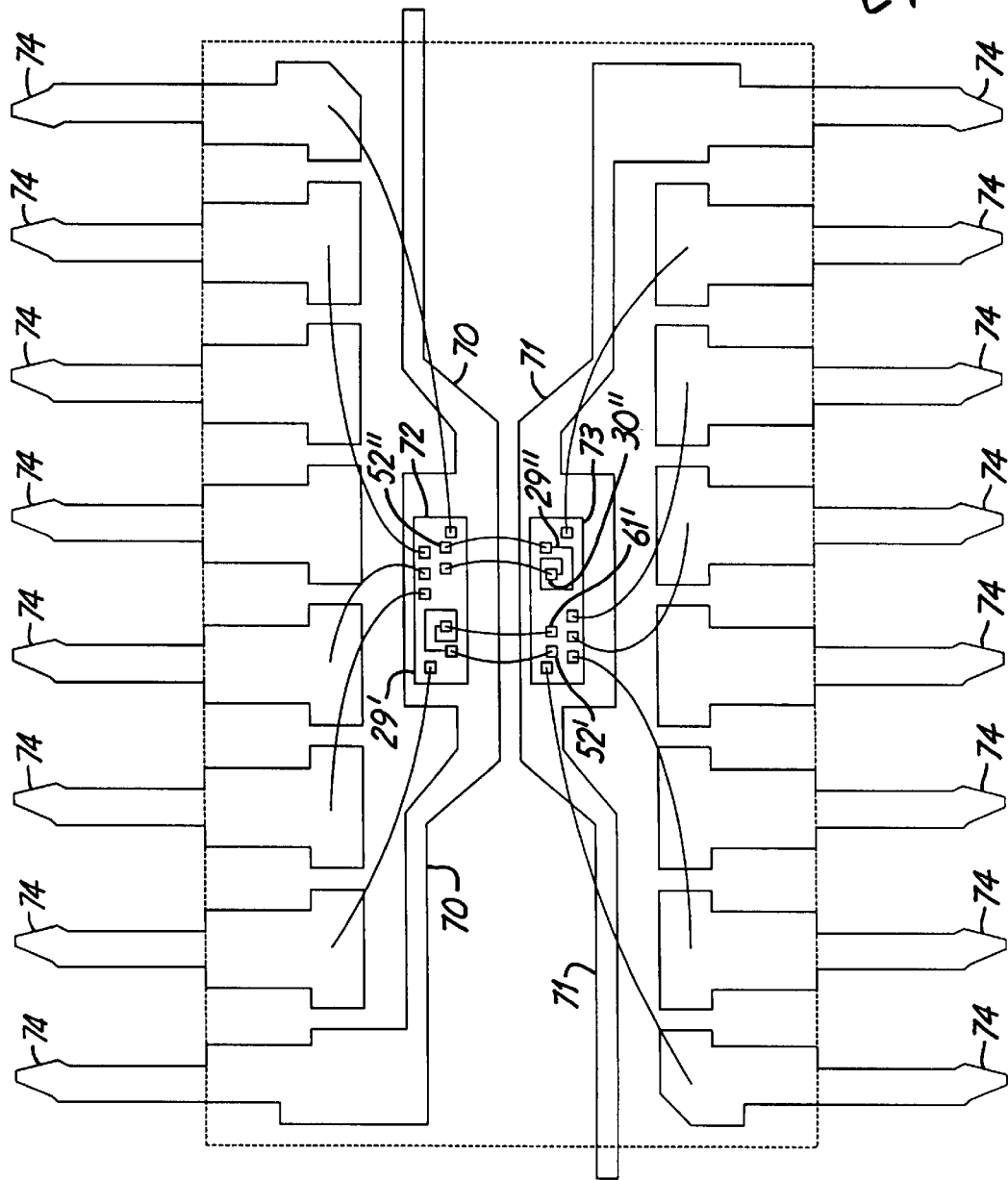
FIG. 5 shows a representation of a housing for monolithic integrated circuit chips embodying the present invention.

Such an arrangement is shown in FIG. 5 where two metal lead frame segments, 70 and 71, support a corresponding monolithic integrated circuit chips, 72 and 73. Interconnection pins, 74, protruding past the periphery of the plastic encapsulation housing, or package, indicated by a dashed housing outline are interconnected by wire bonds, shown as curved lines, extending therefrom to bonding pads shown as small squares. The bonding pads serving to electrically interconnect the bonding wires to the voltage supply terminals and ground reference voltage terminals, and to the input signal terminals, and to the output signal terminals, and to the circuit control terminals are not separately designated. However, an input conductor coil, 29', is shown interconnected by a pair of bonding pads, 30', on chip 70 to which bonding wires extend from a pair of bonding pads, 52' and 61', on chip 71 that are interconnected to the corresponding inverters in the pulse edge current excursion generator circuit in chip 71. Similarly, an input conductor coil, 29", is shown interconnected by a pair of bonding pads, 30", on chip 71 to which bonding wires extend from a pair of bonding pads, 52" and 61", on chip 70 that are interconnected to the corresponding inverters in the pulse edge current excursion generator circuit in chip 70. Thus, the numerical designations with a single prime mark involve structures in one signal isolator, and the numerical designations with two prime marks involve structures in the other signal isolator for transmitting information in a direction opposite to that in which the first signal isolator is to be used for transmitting information.

Figure 6:
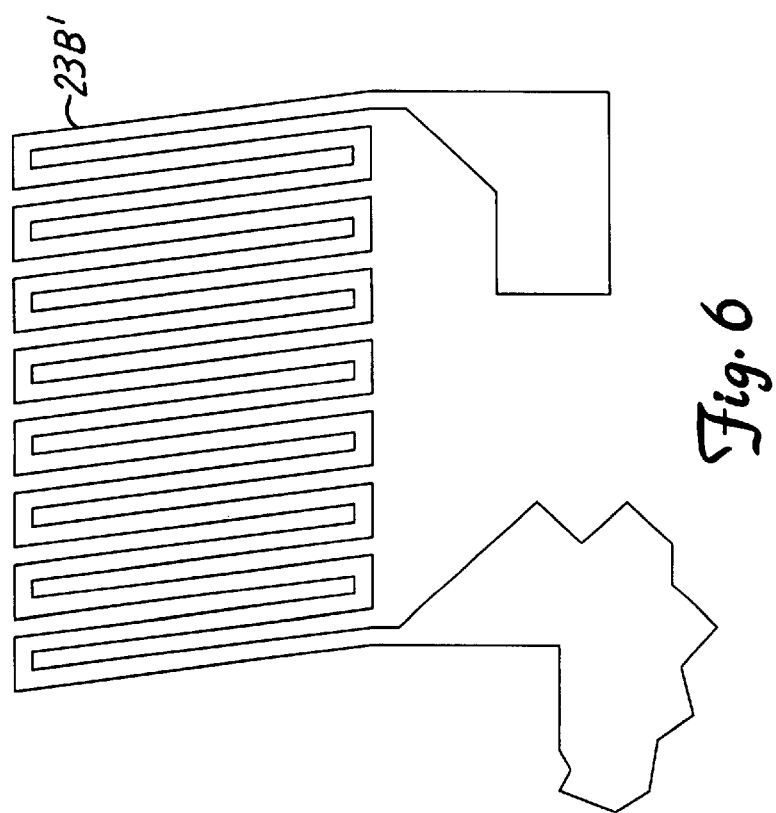
FIG. 6 represents a plan view of a portion of an alternate monolithic integrated circuit structure used in the present invention.

Various alterations can be made to the above described system to change or improve performance. Current in input conductor coil 29, in generating magnetic fields perpendicular to the easy axis of the composite ferromagnetic layer form by strata 16 and 17 leads to switching of the magnetization directional orientation therein to a substantial degree by magnetic domain wall motion therein which is slower than directional orientation switching by rotation of that magnetization. Faster switching can often be obtained by generating magnetic fields at an angle to the material easy axis as then rotational switching tends to dominate. The optimum angle will depend on such factors as the kinds of materials involved and the geometries involved along with other structural details but will typically be in the range of 45° to 90°. Generating fields at an angle with respect to this easy axis can be accomplished by either rotating input conductor or conductor coil 29 with respect to crenelated resistor substructures 23A, 23B, 23C and 23D in the structure of FIG. 1A, or vice verse. FIG. 6 shows a resistor substructure, 23B', which is a modification of resistor substructure 23B of FIG. 1A having the primary extent of that substructure tilted in FIG. 6 to be used as a substitution for substructure 23B in FIG. 1A. Similar substitutions can be made for the other resistor substructures in FIG. 1A so that they all are at an angle with respect the magnetic fields generated by currents in conductor 29 differing from 90°.

Figure 7:
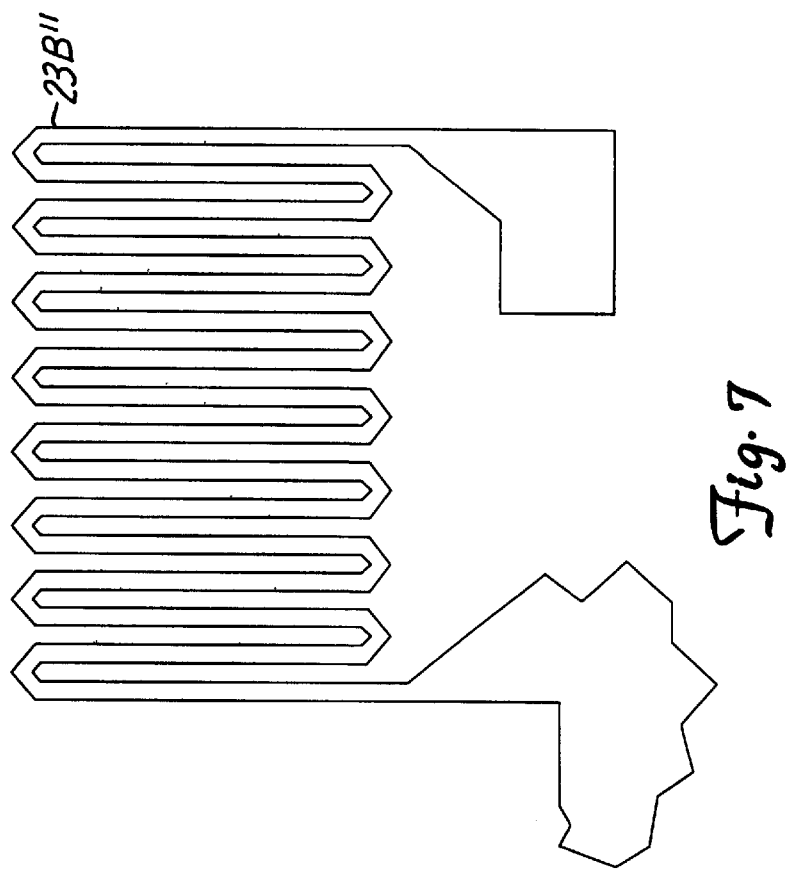
FIG. 7 represents a plan view of a portion of another alternate monolithic integrated circuit structure used in the present invention.

Also, domain wall motion based magnetization direction switching to the extent it occurs can be made faster by reducing the pinning of the domain walls which impedes their motion. One manner of doing so is to taper the ends of the primary extents of the resistor substructures as shown in FIG. 7 for one of them, here designated 23B". A similar geometry would be used for each in the structure of FIG. 1A.

Although the present invention has been described with reference to preferred embodiments, workers skilled in the art will recognize that changes may be made in form and detail without departing from the spirit and scope of the invention.

What is claimed is:

1. A current determiner for providing at an output thereof representations of input currents provided therein from a source of such currents, said current determiner comprising:
a substrate;
an input conductor supported on said substrate suited for conducting said input currents therethrough; and
a first current sensor supported on said substrate adjacent to, yet spaced apart from, said input conductor to thereby be electrically isolated from any direct circuit interconnection therewith on said substrate but positioned in those magnetic fields arising from said input currents, said first current sensor being formed of a plurality of magnetoresistive, anisotropic, ferromagnetic thin-film layers at least two of which are separated from one another by a nonmagnetic layer positioned therebetween and with one of said two ferromagnetic thin-film layers having a magnetization that is substantially maintained in a selected direction despite said magnetic fields arising from said input currents causing reversals of direction of magnetization of that remaining one of said two ferromagnetic thin-film layers.

2. The apparatus of claim 1 wherein that one of said two ferromagnetic thin-film layers of said first current sensor having a magnetization that is substantially maintained in a selected direction has a higher effective coercivity than does said remaining one of said two ferromagnetic thin-film layers.

3. The apparatus of claim 1 further comprising an antiferromagnetic layer positioned at a major surface of that one of said two ferromagnetic thin-film layers of said first current sensor having a magnetization that is substantially maintained in a selected direction.

4. The apparatus of claim 1 wherein said remaining one of said two ferromagnetic thin-film layers of said first current sensor has an easy axis extending in a direction selected from substantially parallel to, and substantially perpendicular to, said selected direction.

5. The apparatus of claim 1 further comprising a signal converter having an input to receive input signals and a pair of outputs between which said input conductor is electrically connected to provide said input currents therein corresponding to said input signals, said signal converter providing said input currents through said input conductor with magnitudes distributed differently over time than are magnitudes of said input signals.

6. The apparatus of claim 1 further comprising a layer of material exhibiting a substantial magnetic permeability positioned near both said input conductor and said first current sensor to serve as a magnetic field concentrator.

7. The apparatus of claim 1 wherein said substrate further comprises a monolithic integrated circuit structure containing electronic circuit components of which at least one is electrically connected to said first current sensor.

8. The apparatus of claim 1 further comprising a second current sensor supported on said substrate adjacent to, yet spaced apart from, said input conductor to thereby be electrically isolated from any direct circuit interconnection therewith on said substrate but positioned in those magnetic fields arising from currents occurring in said input conductor, said second current sensor being formed of a plurality of magnetoresistive, anisotropic, ferromagnetic thin-film layers at least two of which are separated from one another by a nonmagnetic layer positioned therebetween.

9. The apparatus of claim 2 further comprising an antiferromagnetic layer positioned at a major surface of that one of said two ferromagnetic thin-film layers of said first current sensor having a magnetization that is substantially maintained in a selected direction.

10. The apparatus of claim 4 wherein said first current sensor has its primary extent along a first direction on said substrate selected from substantially parallel to, and substantially perpendicular to, said selected direction.

11. The apparatus of claim 5 wherein said input signals are pulse signals having a pulse rate and having magnitudes that are substantially constant over a pulse rate period, and said input currents are pulses having durations which are a fraction of said pulse rate period.

12. The apparatus of claim 5 wherein said signal converter is formed on an input substrate which is separated from said substrate of said current determiner as provided in a housing common to each.

13. The apparatus of claim 7 wherein said monolithic integrated circuit structure containing electronic circuit components and said first current sensor are connected into an electrical circuit having a common voltage reference.

14. The apparatus of claim 8 wherein each of said first and second current sensors is electrically connected to a corresponding one of third and fourth current sensors, said third and fourth current sensors each being formed of a plurality of magnetoresistive, anisotropic, ferromagnetic thin-film layers at least two of which are separated from one another by a nonmagnetic layer positioned therebetween, said fourth current sensor being electrically connected to said third current sensor, said first and third current sensors being electrically connected in series with one another across a source of electrical energization and said second and fourth current sensors being electrically connected in series with one another across a source of electrical energization to form abridge circuit, said third and fourth current sensors supported on said substrate adjacent to, yet spaced apart from, said input conductor to thereby be electrically isolated therefrom but positioned in those magnetic fields arising from said input currents.

15. The apparatus of claim 8 wherein each of said first and second current sensors is electrically connected to a corresponding one of a pair of effective resistors as pair members which are electrically connected to one another, and with one of said pair members being electrically connected in series with said first current sensor across a source of electrical energization and with that remaining pair member being electrically connected in series with said second current sensor across a source of electrical energization to form a bridge circuit.

16. The apparatus of claim 10 wherein said input conductor has its primary extent along a second direction on said substrate selected from being parallel to, and differing from, said first direction.

17. The apparatus of claim 10 wherein portions of said first current sensor extending along said first direction are joined by other portions of said first current sensor having sections therein extending in at least two different directions with respect to said first direction.

18. The apparatus of claim 12 wherein said input substrate further comprises a monolithic integrated circuit structure containing electronic circuit components of which at least one is electrically connected to said input conductor.

19. The apparatus of claim 14 wherein said substrate further comprises a monolithic integrated circuit structure containing electronic circuit components of which at least one is electrically connected to a selected one of said first, second, third and fourth current sensors.

20. The apparatus of claim 14 wherein said input conductor is formed as a multiple turn coil having each said turn therein supported directly on said substrate and each of said first, second, third and fourth current sensors have portions thereof which are substantially identical to one another which are crossed by common ones of said turns of said coil at substantially identical angles.

21. The apparatus of claim 14 wherein said first, second, third and fourth current sensors are substantially symmetrically positioned with respect to said input conductor crossing thereover with substantially similar spacing between adjacent pairs thereof.

22. The apparatus of claim 15 wherein said substrate further comprises a monolithic integrated circuit structure containing electronic circuit components of which at least one is electrically connected to a selected one of said first and second current sensors.

23. The apparatus of claim 15 wherein said input conductor is formed as a multiple turn coil having each said turn therein supported directly on said substrate and each of said first and second current sensors have portions thereof which are substantially identical to one another which are crossed by common ones of said turns of said coil at substantially identical angles.

24. The apparatus of claim 15 wherein said first and second current sensors are substantially symmetrically positioned with respect to said input conductor crossing thereover.

25. The apparatus of claim 16 wherein said first and second directions are substantially orthogonal.

26. The apparatus of claim 16 wherein said first and second directions differ by angles in the range of 45° to 90°.

27. The apparatus of claim 19 wherein a first interconnection structure provided between said first and third current sensors to electrically connect them in series with one another and a second interconnection structure provided between said second and fourth current sensors to electrical connect them in series with one another are formed in interconnection layers in said monolithic integrated circuit structure with at least part of one of said first and second interconnection structures being provided in a said interconnection layer differing from those in which that remaining one is provided.

28. The apparatus of claim 27 further comprising a first layer of material exhibiting a substantial magnetic permeability positioned near both said input conductor and said first and fourth current sensors to serve as a magnetic field concentrator, and a second layer of material exhibiting a substantial magnetic permeability positioned near both said input conductor and said second and third current sensors to serve as a magnetic field concentrator.

29. A current determiner for providing at an output thereof representations of input currents provided therein from a source of such currents, said current determiner comprising:

a substrate;

an input conductor supported on said substrate suited for conducting said input currents therethrough; and a first current sensor supported on said substrate adjacent to, yet spaced apart from, said input conductor at least in part by a polymeric electrical insulating material to thereby be electrically isolated from any direct circuit interconnection therewith on said substrate but positioned in those magnetic fields arising from said input currents, said first current sensor being formed of a plurality of magnetoresistive, anisotropic, ferromagnetic thin-film layers at least two of which are separated from one another by a nonmagnetic layer positioned therebetween.

30. The apparatus of claim 29 wherein at least part of said polymeric electrical insulating material is separated from said input conductor by a base nonmetallic material which has a greater mechanical stiffness than said polymeric electrical insulating material.

31. The apparatus of claim 29 wherein at least part of said polymeric electrical insulating material is positioned against an electrically conductive electric field interrupter so as to be separated from said first current sensor by said electric field interrupter.

32. The apparatus of claim 29 wherein one of said two ferromagnetic thin-film layers has a magnetization that is substantially maintained in a selected direction despite said magnetic fields arising from said input currents causing reversals of direction of magnetization of that remaining one of said two ferromagnetic thin-film layers.

33. The apparatus of claim 29 wherein said substrate further comprises a monolithic integrated circuit structure containing electronic circuit components of which at least one is electrically connected to said first current sensor.

34. The apparatus of claim 31 wherein said substrate further comprises a monolithic integrated circuit structure containing electronic circuit components of which at least one is electrically connected to said first current sensor.

35. The apparatus of claim 33 wherein said monolithic integrated circuit structure containing electronic circuit components and said first current sensor are connected into an electrical circuit having a common voltage reference.

36. The apparatus of claim 34 wherein said monolithic integrated circuit structure containing electronic circuit components and said first current sensor are connected into an electrical circuit having a common voltage reference.

37. The apparatus of claim 36 wherein said electric field interrupter is maintained at said common reference voltage.

38. A duplex signal isolator for providing at a pair of outputs thereof corresponding representations of input signals provided thereto from a corresponding pair of sources of such input signals, said duplex signal isolator comprising:

a pair of integrated circuits with each integrated circuit member of this pair having an output for providing representations of input currents provided thereto from that remaining pair member, said pair of integrated circuits each comprising:

a substrate;

a signal converter supported on said substrate and having an input to receive input signals from a corresponding one of said pair of sources of such input signals, and further having a pair of outputs for providing input currents to that other pair member, said signal converter providing said input currents at said outputs thereof with magnitudes distributed differently over time than are magnitudes of said input signals received thereby;

an input conductor supported on said substrate electrically connected to said signal converter outputs of that remaining said pair member and suited for conducting said input currents therethrough received at said signal converter outputs of that other pair member; and a first current sensor supported on said substrate adjacent to, yet spaced apart from, said input conductor on said substrate to thereby be electrically isolated from any direct circuit interconnection therewith on said substrate but positioned in those magnetic fields arising from said input currents in that input conductor, said first current sensor being formed of a plurality of magnetoresistive, anisotropic, ferromagnetic thin-film layers at least two of which are separated from one another by a nonmagnetic layer positioned therebetween; and a housing containing both of said pair members such that they are separated from one another except for said electrical connections between said input conductor of one said pair member and said signal converter outputs of that remaining said pair member.

39. The apparatus of claim 38 wherein each said substrate of a pair member further comprises a monolithic integrated circuit structure containing electronic circuit components of which at least one is electrically connected to said first current sensor thereon and at least one is electrically connected to said input conductor thereon.

40. The apparatus of claim 38 wherein one of said two ferromagnetic thin-film layers in each of said pair members has a magnetization that is substantially maintained in a selected direction despite said magnetic fields arising from said input currents causing reversals of direction of magnetization of that remaining one of said two ferromagnetic thin-film layers.

41. The apparatus of claim 38 wherein said first current sensor in each of said pair members is spaced apart from said input conductor in that member at least in part by a polymeric electrical insulating material.

* * * * *

UNITED STATES PATENT AND TRADEMARK OFFICE
CERTIFICATE OF CORRECTION

PATENT NO.   : 6,300,617 B1
DATED        : October 9, 2001
INVENTOR(S)  : James M. Daughton et al.

It is certified that error appears in the above-identified patent and that said Letters Patent is hereby corrected as shown below:

Column 26,
Line 43, delete "abridge", insert -- a bridge --

Signed and Sealed this

Eleventh Day of June, 2002

*Attest:*

*Attesting Officer*

JAMES E. ROGAN
*Director of the United States Patent and Trademark Office*